United States Patent
Ogihara

Patent Number: 6,100,139
Date of Patent: Aug. 8, 2000

[54] METHOD FOR PRODUCING SEMICONDUCTOR DEVICE

[75] Inventor: Hidetoshi Ogihara, Minato-ku, Japan

[73] Assignee: Oki Electric Industry Co., Ltd., Tokyo, Japan

[21] Appl. No.: 08/982,122

[22] Filed: Dec. 2, 1997

[51] Int. Cl.$^7$ .............................. H01L 21/8242
[52] U.S. Cl. ................. 438/255; 438/253; 438/254; 438/396; 438/397; 438/398
[58] Field of Search ................... 257/301, 303, 257/304, 306, 309, 532, 534; 438/243, 244, 253, 254, 255, 386, 387, 396, 397, 398

[56] References Cited

U.S. PATENT DOCUMENTS

| | | | |
|---|---|---|---|
| 5,162,248 | 11/1992 | Dennison et al. | 438/398 |
| 5,623,243 | 4/1997 | Watanabe et al. | |
| 5,763,286 | 6/1998 | Figura et al. | 438/398 |
| 5,770,500 | 6/1998 | Batra et al. | 438/255 |
| 5,827,766 | 10/1998 | Lou | 438/253 |
| 5,874,334 | 2/1999 | Jenq et al. | 438/253 |
| 6,004,857 | 12/1999 | Hsiao et al. | 438/396 |
| 6,010,942 | 1/2000 | Chien et al. | 438/396 |

OTHER PUBLICATIONS

M. Yoshimaru et al., "Rugged Surface Poly–Si Electrode and Low Temperature Deposited Si3N4 for 64MBit and Beyond STC Dram Cell", IEDM 90, 1990, pp. 659–662, (IEEE).

S.P. Sim et al., "A new Stacked SMVP (Surrounded Micro Villus Patterning) Cell for 256 Mega and 1 Giga bit DRAMs", Extended Abstracts of the 1993 International Conference on Solid State Devices and Materials, 1993, pp. 886–888.

*Primary Examiner*—Carl Whitehead, Jr.
*Assistant Examiner*—Toniae M. Thomas
*Attorney, Agent, or Firm*—Jones Volentine, L.L.P.

[57] ABSTRACT

Three independent methods for producing a semiconductor device which acts as a monolithic capacitor including a first embodiment having a step for removing $SiO_2$ particles deposited in space remained under a conductive polycrystalline Si layer having a rugged surface, for the purpose to eliminate possibilities in which dust is produced in the process, a second embodiment having a step for producing an $SiO_2$ layer on a conductive polycrystalline Si layer having a rugged surface employing a CVD process which employs thermal decomposition of TEOS in an excess volume of $O_3$ in which no $SiO_2$ particles are produced in space remained under a conductive polycrystalline Si layer having a rugged surface and a third embodiment in which a step for producing a conductive polycrystalline Si layer under a conductive polycrystalline Si layer having a rugged surface is eliminated, for the purpose to eliminate possibilities in which dust is produced in the process.

5 Claims, 20 Drawing Sheets

F I G. 2 5
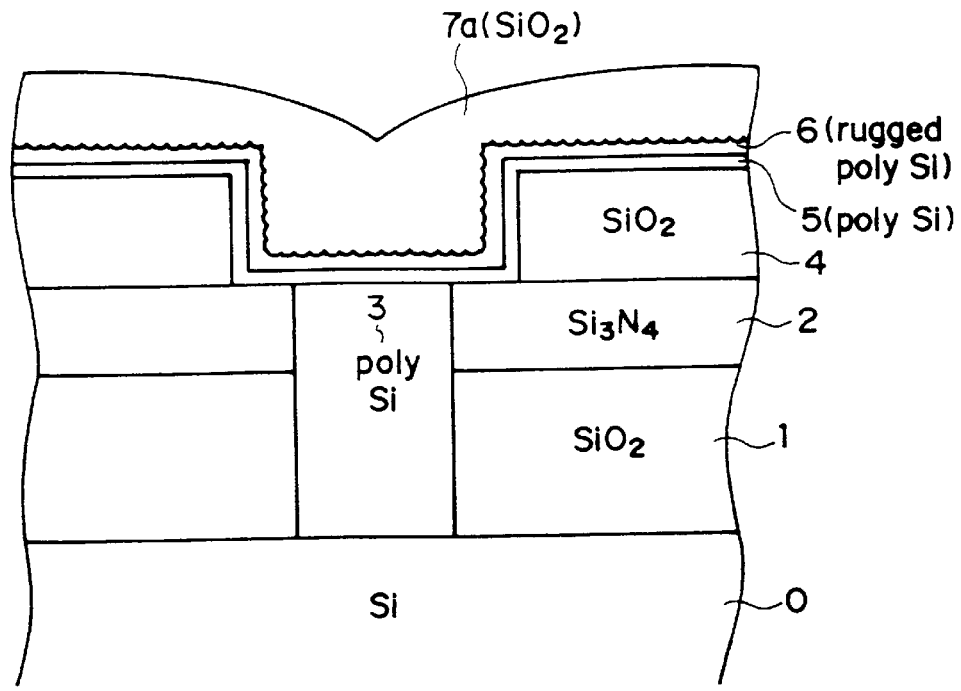
F I G. 2 6
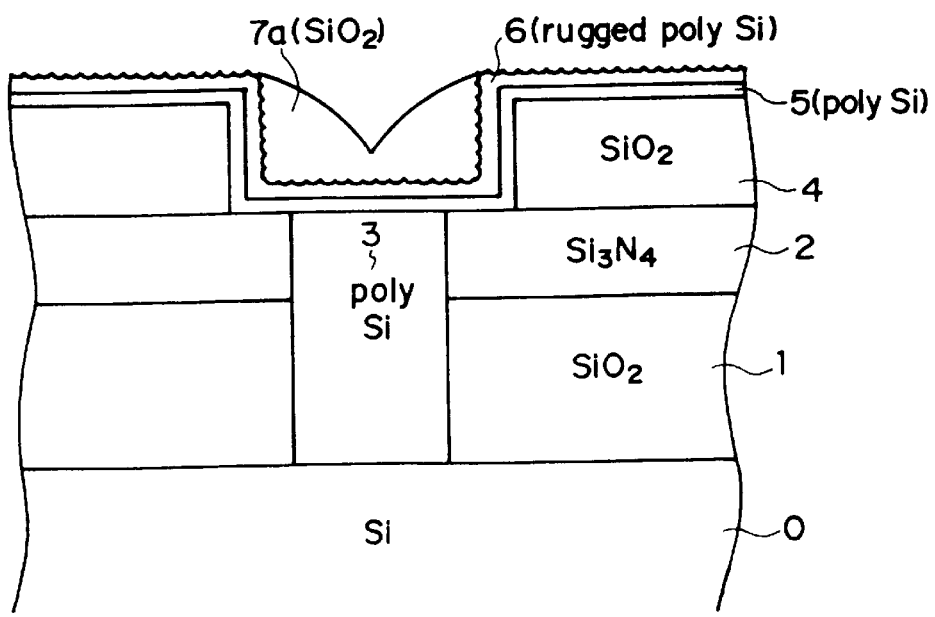

METHOD FOR PRODUCING SEMICONDUCTOR DEVICE

FIELD OF THE INVENTION

This invention relates to an improvement applicable to a method for producing a semiconductor device which acts as a capacitor or a monolithic capacitor. More specifically, this invention relates to an improvement developed for improving the throughput of a method for producing a semiconductor device which acts as a monolithic capacitor, the improvement being realized by preventing dust from being produced during the process.

BACKGROUND OF THE INVENTION AND PRIOR ART STATEMENT

A capacitor is one of the components essential for composing an electronic circuit. Thus, a capacitor in a monolithic structure is useful for producing a semiconductor device circuit or an integrated circuit (an IC). Since the magnitude of electrostatic capacity of a capacitor is proportional to the magnitude of the area of two electrodes which face each other, leaving a dielectric layer therebetween, various efforts have been used to increase the area of two electrodes composing a capacitor in a monolithic structure.

Among plural pieces of prior act in this category, a U.S. Pat. No. 5,623,243 granted for Hirohito Watanabe et al. on Apr. 22, 1997 can be a piece of information disclosing the technology relating to a semiconductor device acting as a capacitor in which a polycrystalline Si layer having a surface with micro roughness caused by Si grains which are generated by employing an LPCVD process which is conducted at a specific temperature condition in which the crystal state of the deposited Si film is transiting from the amorphous phase to the polycrystalline phase, is employed as one of the electrodes.

Referring to drawings, an exemplary process for producing a semiconductor device acting as a capacitor in which a polycrystalline Si layer having a rugged surface is employed for one of the two electrodes which face each other, leaving a dielectric layer therebetween, will be described below.

Referring to FIG. 1, a CVD process is conducted to produce an $SiO_2$ layer (1) having an approximate thickness of 800 nm on a conductive Si substrate (0). A CVD process is conducted to produce an $Si_3N_4$ layer (2) having an approximate thickness of 100 nm on the $SiO_2$ layer (1).

Referring to FIG. 2, a photo lithography process is conducted to produce a recess having an approximate diameter of 200 nm and an approximate depth of 900 nm from the top surface of the $Si_3N_4$ layer (2). For this purpose, an anisotropic etching process is employed to etch the $Si_3N_4$ layer (2) and the $SiO_2$ layer (1) from a selected area remained uncovered by a photo resist mask. A mixture of $C_4F_8$, CO, Ar and $O_2$ can be employed as the etchant gas. As a result, the top surface of the conductive Si substrate (0) is exposed at a location corresponding to the recess. A CVD process is conducted to produce a polycrystalline Si layer (3) containing an impurity having a conductivity identical to that of the Si substrate (0) to an approximate concentration of $5 \times 10^{20}$ $cm^{-3}$, on the $Si_3N_4$ layer (2), which resultantly buries the recess produced in the foregoing process. The thickness of the conductive polycrystalline Si layer (3) is approximately 300 nm on top of the surface of the $Si_3N_4$ layer (2).

Referring to FIG. 3, the conductive polycrystalline Si layer (3) is etch-backed to expose the top surface of the $Si_3N_4$ layer (2). $Cl_2$ can be employed as the etchant gas. In this manner, the conductive polycrystalline Si layer (3) is remained in the recess in the shape of a conductive plug electrically connected with the conductive Si substrate (0).

Referring to FIG. 4, a CVD process is conducted to produce an $SiO_2$ layer (4) having an approximate thickness of 600 nm on the $Si_3N_4$ layer (2) and the conductive Si plug (3).

Referring to FIG. 5, a photo lithography process is conducted to produce a recess having an approximate diameter of 300 through 500 nm and an approximate depth of 300 nm from the top surface of the $SiO_2$ layer (4). For this purpose, a mixture of $CF_4$, $CHF_3$, and Ar can be employed as the etchant gas. As a result, the top surface of the plug-shaped conductive polycrystalline Si layer (3) is exposed. A CVD process is conducted to produce a polycrystalline Si layer (5) containing an impurity having a conductivity identical to that which is contained in the conductive polycrystalline Si plug (3) to an approximate concentration of $5 \times 10^{20}$ $cm^{-3}$ and having an approximate thickness of 50 nm, on top of the conductive polycrystalline Si plug (3) and the $SiO_2$ layer (4). Further, an LPCVD process is conducted in $SiH_4$ at a pressure of 0.2 torr and at a temperature of 570° C. to produce a conductive polycrystalline Si layer (6) having a rugged surface and having an approximate thickness of 50 nm on top of the conductive polycrystalline Si layer (5). The production of the rugged surface is caused by coexistence of amorphous regions and polycrystalline grains in the conductive polycrystalline Si (5) having a rugged surface (6) in which an amorphous phase is transiting to a polycrystalline phase. (See a paper, IEDM 90-661, entitled "RUGGED SURFACE POLY-Si ELECTRODE AND LOW TEMPERATURE DEPOSITED $Si_3N_4$ FOR 64-MBIT AND BEYOND STC DRAM CELL" written by M. Yoshimaru et al. and published by IEEE on 1990 and available as CH 2865-4/90/0000-0659 at IEEE.) A CVD process is conducted to produce an $SiO_2$ layer (7) having an approximate thickness of 300 nm on top of the conductive polycrystalline Si layer (6) having a rugged surface.

Referring to FIG. 6, $SiO_2$ particles (8) are deposited in space remained among the top surface of the conductive polycrystalline Si layer (5) and each gain composing the conductive polycrystalline Si layer (6) having a rugged surface, during the foregoing CVD process for producing the conductive polycrystalline Si layer (6) having a rugged surface. Since the $SiO_2$ particles (8) deposited on the area in which the monolithic capacitor is not produced, causes serious problems in a later process, the scope of FIG. 6 is limited to the area in which the monolithic capacitor is not produced.

Referring to FIG. 7, an anisotropic etching process is conducted to etch-back the $SiO_2$ layer (7) until the conductive polycrystalline Si layer (6) having a rugged surface is exposed. A mixture of $CF_4$, $CHF_3$ and Ar can be employed as the etchant gas.

Referring to FIG. 8, employing the $SiO_2$ layer (7) as an etching mask, an anisotropic etching process is conducted to remove the conductive polycrystalline Si layer (6) having a rugged surface and the conductive polycrystalline Si layer (5) from the top of the $SiO_2$ layer (4). For this process, $Cl_2$ can be employed as the etchant gas. Since the $SiO_2$ particles (8) deposited in space remained among the top surface of the conductive polycrystalline Si layer (5) and each grain composing the conductive polycrystalline Si layer (6) having a rugged surface acts as a type of etching mask during the foregoing etching process, plural pillars of the conductive polycrystalline Si layer (5) remain on top of the SiO$_2$ layer (4).

Referring to FIG. 9, an isotropic etching process is conducted to entirely remove the SiO$_2$ layer (7) and the SiO$_2$ layer (4). For this process, HF can be employed as the etchant. During this etching process, however, the foregoing plural pillars of the conductive polycrystalline Si layer (5) are disengaged from the SiO$_2$ layer (4) to become dust floating in the etchant liquid, which dust is finally deposited again on the surface of an Si wafer to finally cause adverse results for the throughput of a method for producing a semiconductor device which acts as a capacitor.

Produced in this manner is one of the electrodes of a monolithic capacitor, the electrode having the shape of a vertical cylinder having an open end upward and a closed end downward made of a conductive polycrystalline Si layer (5) covered by the conductive polycrystalline Si layer (6) having a rugged surface, and resultantly having a large magnitude of the surface area thereof.

Referring to FIG. 10, a CVD process is conducted to produce a dielectric layer (9) e.g. an Si$_3$N$_4$ layer, a piled layer of SiO$_2$/Si$_3$N$_4$/SiO$_2$ and the like to cover the electrode having the shape of a vertical cylinder having an open end upward and a closed end downward made of a conductive polycrystalline Si layer (5) covered by the conductive polycrystalline Si layer (6) having a rugged surface produced by the foregoing series of steps. A CVD process is conducted to produce a conductive polycrystalline Si layer (10) to cover the dielectric layer (9). The conductivity of the conductive polycrystalline Si layer (10) is free. Needless to emphasize, the conductive polycrystalline Si layer (10) is extended to produce an electrode of a terminal (not shown) of the monolithic capacitor produced by the foregoing series of steps. As a final step, a passivation process is usually conducted.

The foregoing description has elaborated the drawbacks which accompanies the foregoing method available in the prior art for producing a semiconductor device which acts as a monolithic capacitor, which monolithic capacitor has a large magnitude of electrostatic capacity due to a large area of one of the electrodes composing the monolithic capacitor.

OBJECTS AND SUMMARY OF THE INVENTION

Accordingly, an object of this invention is to provide a method for producing a semiconductor device which acts as a monolithic capacitor, which method can enjoy a large magnitude of the throughput realized by eliminating possibilities in which dust is produced in one of the processes to be deposited again on the surface of a semiconductor wafer.

To achieve the foregoing object, a method for producing a semiconductor device which acts as a monolithic capacitor in accordance with a first embodiment of this invention comprises:

a step for providing a plug-shaped conductive semiconductor layer on a conductive semiconductor substrate, the plug-shaped conductive semiconductor layer being surrounded by an insulator layer, a step for producing a semiconductor oxide layer on the insulator layer, the semiconductor oxide layer having an opening at a location corresponding to the plug-shaped conductive semiconductor layer, a step for producing a conductive semiconductor layer and a conductive semiconductor layer having a rugged surface on the plug-shaped conductive semiconductor layer and the semiconductor oxide layer, a step for producing an etching mask layer of a semiconductor oxide on the conductive semiconductor layer having a rugged surface, a step for etching back the etching mask layer until the top surface of the conductive semiconductor layer having a rugged surface is exposed, to convert the etching mask layer to an etching mask, a step for causing the conductive semiconductor layer having a rugged surface to contact an etchant reactive with a semiconductor oxide, to remove semiconductor oxide particles deposited in space remained between the top surface of the conductive semiconductor layer and grains of the conductive semiconductor layer having a rugged surface, a step for etching the conductive semiconductor layer having a rugged surface, the conductive semiconductor layer and the semiconductor oxide layer, employing the etching mask, to produce one electrode having a shape of a vertical cylinder having an open top end and a closed bottom end, a step for producing a dielectric layer to cover at least the one electrode having a shape of a vertical cylinder having an open top end and a closed bottom end, and a step for producing the other electrode of a conductive material, the other electrode covering the dielectric layer.

To achieve the foregoing object, a method for producing a semiconductor device which acts as a monolithic capacitor in accordance with a second embodiment of this invention comprises:

a step for producing a plug-shaped conductive semiconductor layer on a conductive semiconductor substrate, the plug-shaped conductive semiconductor layer being surrounded by an insulator layer, a step for producing a semiconductor oxide layer on the insulator layer, the semiconductor oxide layer having an opening at a location corresponding to the plug-shaped conductive semiconductor layer, a step for producing a conductive semiconductor layer and a conductive semiconductor layer having a rugged surface on the plug-shaped conductive semiconductor layer and the semiconductor oxide layer, a step for producing an etching mask layer on the conductive semiconductor layer having a rugged surface, employing a process employing thermal decomposition of tetraethylorthosilicate in an excess volume of O$_3$, a step for etching back the etching mask layer until the top surface of the conductive semiconductor layer having a rugged surface is exposed, to convert the etching mask layer to an etching mask, a step for etching the conductive semiconductor layer having a rugged surface, the conductive semiconductor layer and the semiconductor oxide layer, employing the etching mask, to produce one electrode having a shape of a vertical cylinder having an open top end and a closed bottom end, a step for producing a dielectric layer to cover at least the one electrode having a shape of a vertical cylinder having an open top end and a closed bottom end, and a step for producing the other electrode of a conductive material, the other electrode covering the dielectric layer.

In the foregoing method, the volumetric ratio of O$_3$ and tetraethylorthosilicate contained in a reaction gas employable for the process for producing the etching mask layer can be approximately 10:1.

To achieve the foregoing object, a method for producing a semiconductor device which acts as a monolithic capacitor in accordance with a third embodiment of this invention comprises:

a step for producing a plug-shaped conductive semiconductor layer on a conductive semiconductor substrate, the plug-shaped conductive semiconductor layer being surrounded by an insulator layer, a step for producing a semiconductor oxide layer on the insulator layer, the semiconductor oxide layer having an opening at a location corresponding to the plug-shaped conductive semiconductor layer, a step for producing a conductive semiconductor layer on the plug-shaped conductive semiconductor layer and on the semiconductor oxide layer having an opening at a location corresponding to the plug-shaped conductive semiconductor layer, a step for producing a first etching mask layer on the conductive semiconductor layer, a step for etching back the first etching mask layer until the top surface of the conductive semiconductor layer is exposed, to convert the first etching mask layer to a first etching mask, at a location corresponding to the plug-shaped conductive semiconductor layer, a step for removing the conductive semiconductor layer from the area on which the capacitor is not produced, a step for producing a conductive semiconductor layer having a rugged surface on the conductive semiconductor layer and on the semiconductor oxide layer, a step for producing a second etching mask layer on the conductive semiconductor layer having a rugged surface, a step for etching back the second etching mask layer until the top surface of the conductive semiconductor layer having a rugged surface is exposed, to convert the second etching mask layer to a second etching mask, a step for etching the conductive semiconductor layer having a rugged surface and the semiconductor oxide layer, employing the second etching mask, to produce one electrode having a shape of a vertical cylinder having an open top end and a closed bottom end, a step for producing a dielectric layer to cover at least the one electrode having a shape of a vertical cylinder having an open top end and a closed bottom end, and a step for producing the other electrode of a conductive material, the other electrode covering the dielectric layer.

In the foregoing method, the first etching mask layer can be a photo resist layer and the second etching mask layer can be a semiconductor oxide layer.

BRIEF DESCRIPTION OF THE DRAWINGS

This invention, together with its various features and advantages, can be readily understood from the following more detailed description presented in conjunction with the following drawings, in which:

FIG. 25 is a schematic cross section of a semiconductor device acting as a capacitor or a monolithic capacitor under progress of a method for producing a semiconductor device acting as a capacitor in accordance with the second embodiment of this invention, FIG. 26 is a schematic cross section of a semiconductor device acting as a capacitor or a monolithic capacitor under progress of a method for producing a semiconductor device acting as a capacitor in accordance with the second embodiment of this invention.

DETAILED DESCRIPTION OF THE PREFERRED EMBODIMENTS OF THIS INVENTION

Referring to drawings, methods for producing semiconductor device in accordance with three independent embodiments of this invention will be described below.

First Embodiment

A method for producing a semiconductor device acting as a monolithic capacitor, the method having a step for removing $SiO_2$ particles deposited in space remained among the top surface of a polycrystalline Si layer and each grain composing a polycrystalline Si layer having a rugged surface produced on the polycrystalline Si layer, by dipping a Si wafer in a water solution containing HF in a concentration of 1%, before proceeding to a step for removing the polycrystalline Si layer having a rugged surface.

Figure 11:
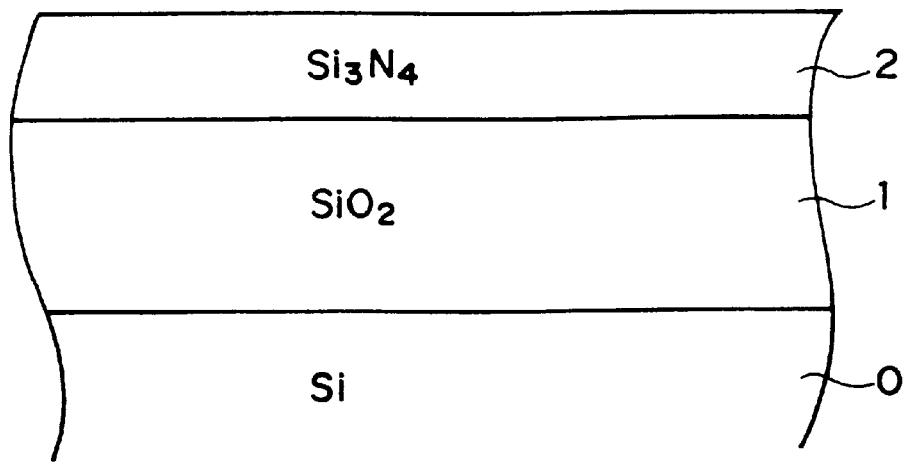
FIG. 11 is a schematic cross section of a semiconductor device acting as a capacitor or a monolithic capacitor under progress of a method for producing a semiconductor device acting as a capacitor in accordance with the first embodiment of this invention.

Referring to FIG. 11, a CVD process is conducted to produce an $SiO_2$ layer (1) having an approximate thickness of 800 nm on a conductive Si substrate (0). A CVD process is conducted to produce an $Si_3N_4$ layer (2) having an approximate thickness of 100 nm on the $SiO_2$ layer (1).

Figure 12:
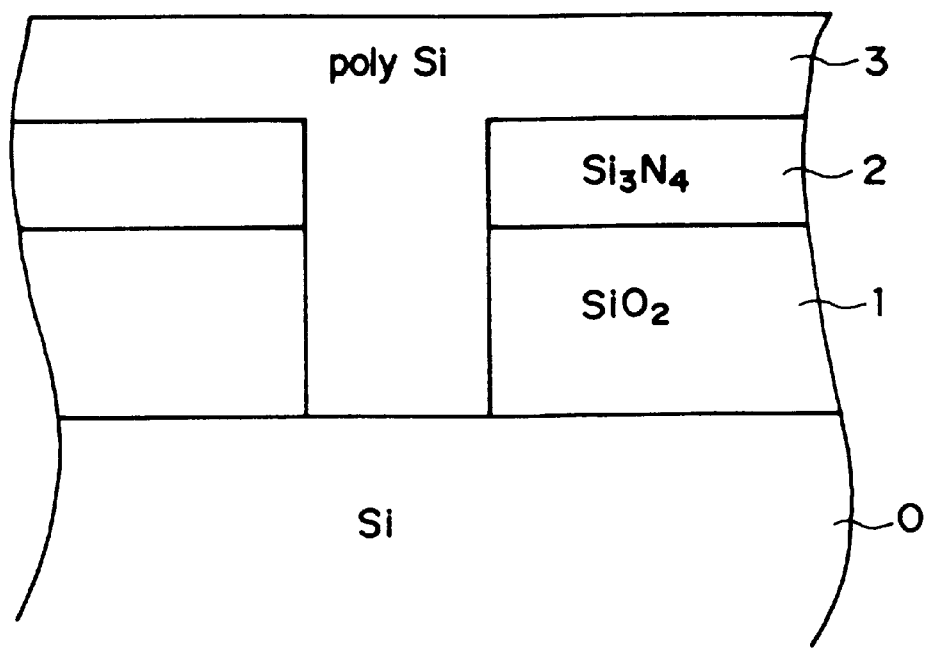
FIG. 12 is a schematic cross section of a semiconductor device acting as a capacitor or a monolithic capacitor under progress of a method for producing a semiconductor device acting as a capacitor in accordance with the first embodiment of this invention.

Referring to FIG. 12, a photo lithography process is conducted to produce a recess having an approximate diameter of 200 nm and an approximate depth of 900 nm from the top surface of the $Si_3N_4$ layer (2). For this process, an anisotropic etching process is employed to etch the $Si_3N_4$ layer (2) and the $SiO_2$ layer (1) from a selected area remained uncovered by a photo resist mask. A mixture of $C_4F_8$, CO, Ar and $O_2$ can be employed as the etchant gas. As a result, the top surface of the conductive Si substrate (0) is exposed at a location corresponding to the recess. A CVD process is conducted to produce a polycrystalline Si layer (3) containing an impurity having a conductivity identical to that of the Si substrate (0) to an approximate concentration of $5 \times 10^{20}$ cm$^{-3}$, on the $Si_3N_4$ layer (2), which resultantly buries the recess produced in the foregoing process. The thickness of the conductive polycrystalline Si layer (3) is approximately 300 nm on top of the surface of the $Si_3N_4$ layer (2).

Figure 13:
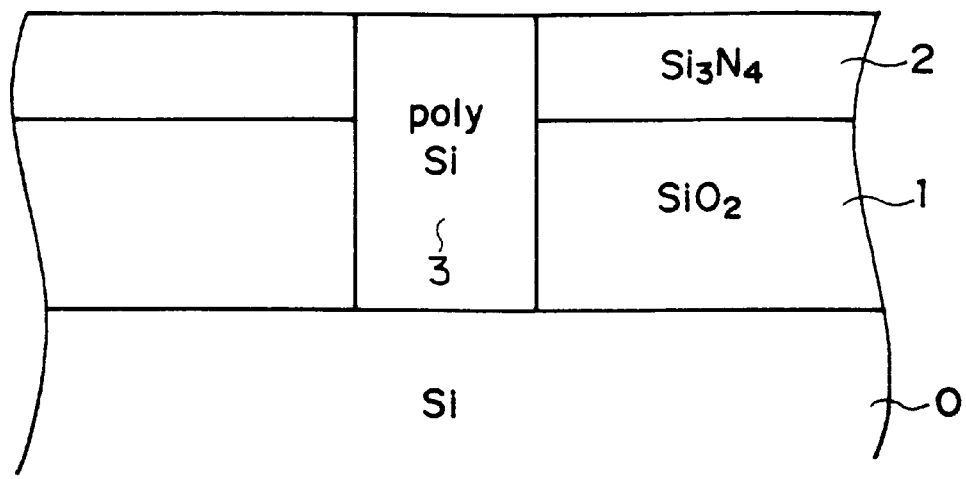
FIG. 13 is a schematic cross section of a semiconductor device acting as a capacitor or a monolithic capacitor under progress of a method for producing a semiconductor device acting as a capacitor in accordance with the first embodiment of this invention.

Referring to FIG. 13, the conductive polycrystalline Si layer (3) is etch-backed to expose the top surface of the $Si_3N_4$ layer (2). $Cl_2$ can be employed as the etchant gas. In this manner, the conductive polycrystalline Si layer (3) is remained in the recess in the shape of a conductive plug electrically connected with the conductive Si substrate (0).

Figure 14:
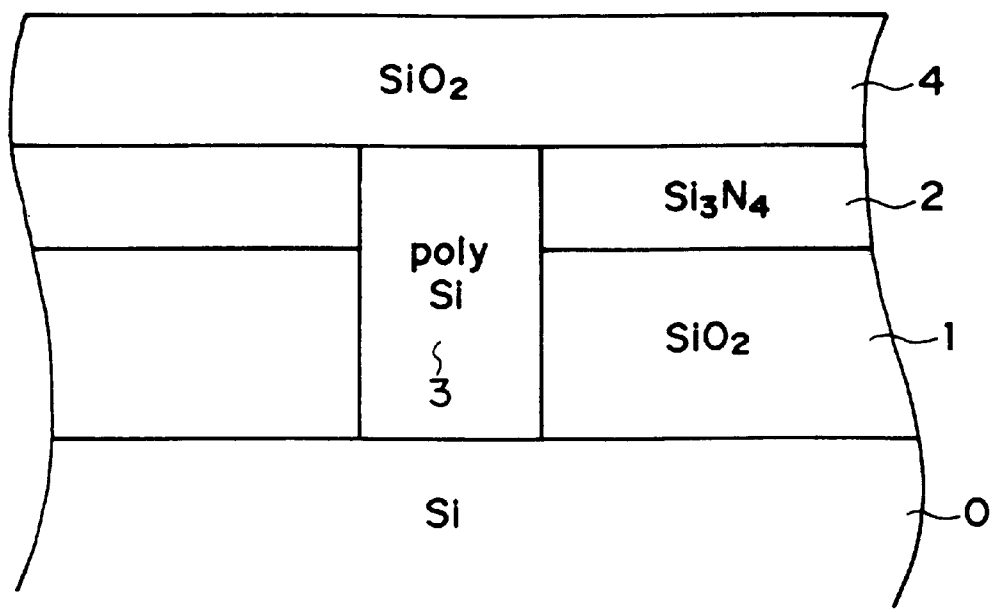
FIG. 14 is a schematic cross section of a semiconductor device acting as a capacitor or a monolithic capacitor under progress of a method for producing a semiconductor device acting as a capacitor in accordance with the first embodiment of this invention.

Referring to FIG. 14, a CVD process is conducted to produce an $SiO_2$ layer (4) having an approximate thickness of 600 nm on the $Si_3N_4$ layer (2) and the conductive Si plug (3).

Figure 15:
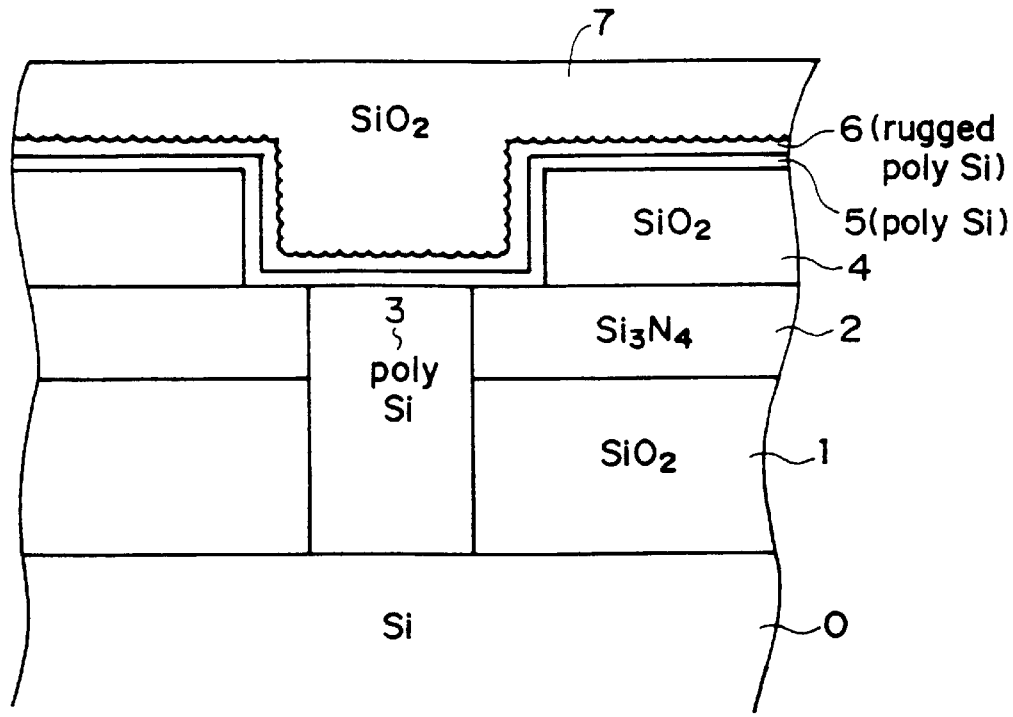
FIG. 15 is a schematic cross section of a semiconductor device acting as a capacitor or a monolithic capacitor under progress of a method for producing a semiconductor device acting as a capacitor in accordance with the first embodiment of this invention.

Referring to FIG. 15, a photo lithography process is conducted to produce a recess having an approximate diameter of 300 through 500 nm and an approximate depth of 300 nm from the top surface of the $SiO_2$ layer (4). For this purpose, a mixture of $CF_4$, $CHF_3$ and Ar can be employed as the etchant gas. As a result, the top surface of the plug-shaped conductive polycrystalline Si layer (3) is exposed. A CVD process is conducted to produce a polycrystalline Si layer (5) containing an impurity having a conductivity identical to that which is contained in the conductive polycrystalline Si plug (3) to an approximate concentration of $5 \times 10^{20}$ cm$^{-3}$ and having an approximate thickness of 50 nm, on top of the conductive polycrystalline Si plug (3) and the $SiO_2$ layer (4). Further, an LPCVD process is conducted in $SiH_4$ at a pressure of 0.2 torr and a temperature of 570° C. to produce a conductive polycrystalline Si layer (6) having a rugged surface and having an approximate thickness of 50 nm on top of the conductive polycrystalline Si layer (5). As was described earlier, the production of the rugged surface is caused by coexistence of amorphous regions and polycrystalline grains in the conductive polycrystalline Si layer having a rugged surface (6) in which an amorphous phase is transiting to a polycrystalline phase. A CVD process is conducted to produce an $SiO_2$ layer (7) having an approximate thickness of 300 nm on top of the conductive polycrystalline Si layer (6) having a rugged surface.

Figure 16:
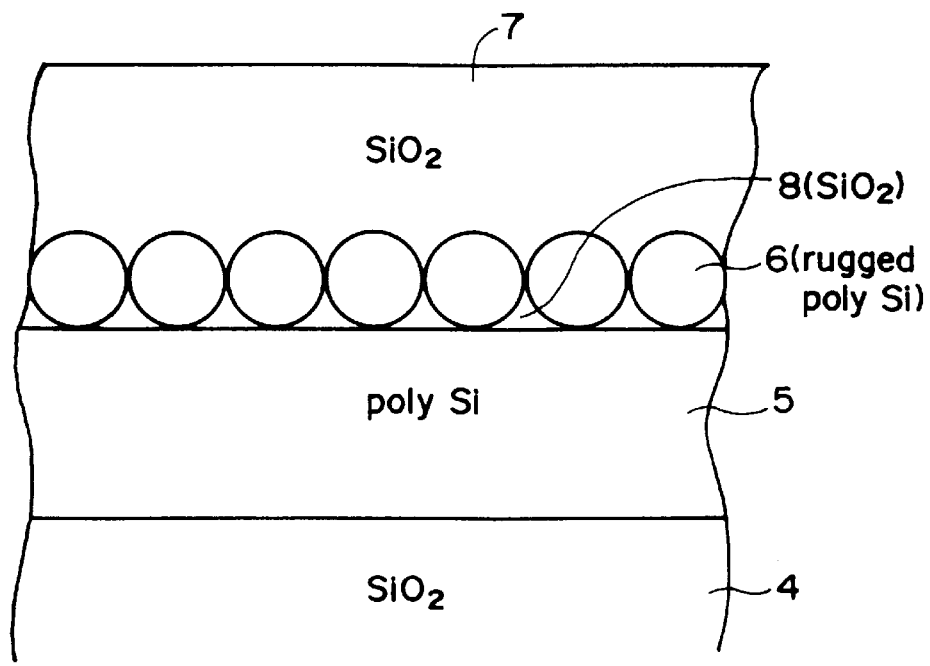
FIG. 16 is a schematic cross section of a polycrystalline Si layer having a rugged surface covered by an $SiO_2$ layer, remaining $SiO_2$ particles in space between grains of the polycrystalline Si layer having a rugged surface and a polycrystalline Si layer on which the polycrystalline Si layer having a rugged surface is produced.

Referring to FIG. 16, $SiO_2$ particles (8) are deposited in space remained among the top surface of the conductive polycrystalline Si layer (5) and each gain composing the conductive polycrystalline Si layer (6) having a rugged surface, during the foregoing CVD process for producing the $SiO_2$ layer (7). The scope of FIG. 16 is limited to the area in which the monolithic capacitor is not produced or to the area from which the conductive polycrystalline Si layer (6) having a rugged surface is removed in a later step.

Figure 17:
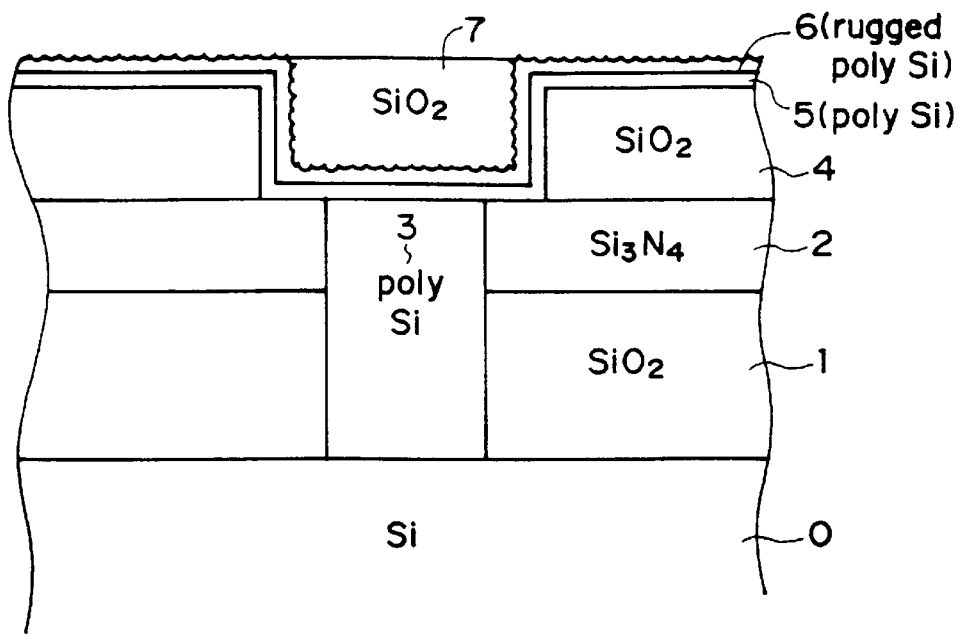
FIG. 17 is a schematic cross section of a semiconductor device acting as a capacitor or a monolithic capacitor under progress of a method for producing a semiconductor device acting as a capacitor in accordance with the first embodiment of this invention.

Referring to FIG. 17, an anisotropic etching process is conducted to etch-back the $SiO_2$ layer (7) until the conductive polycrystalline Si layer (6) having a rugged surface is exposed. A mixture of $CF_4$, $CHF_3$ and Ar can be employed as the etching gas.

Figure 18:
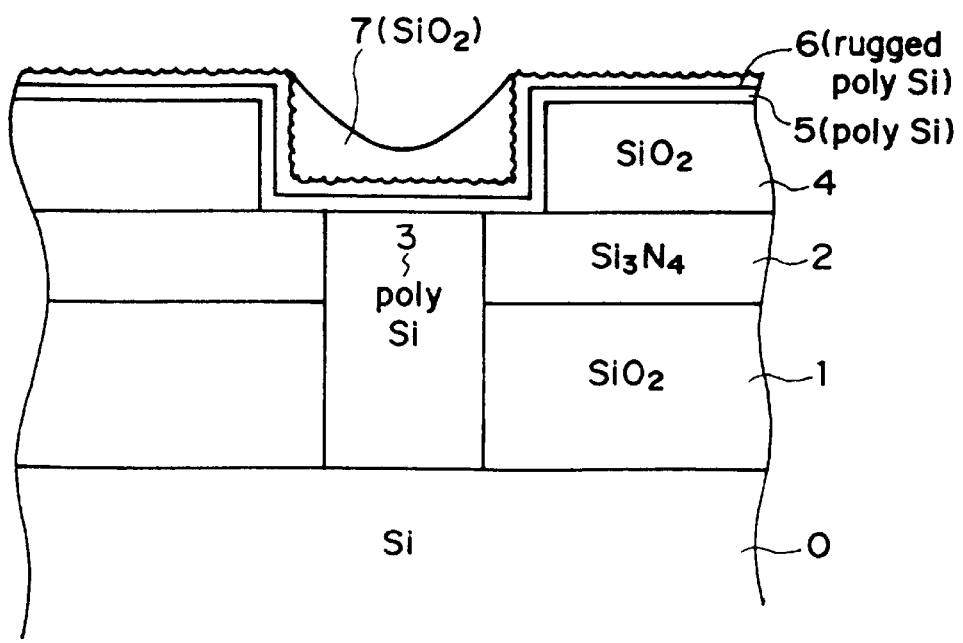
FIG. 18 is a schematic cross section of a semiconductor device acting as a capacitor or a monolithic capacitor under progress of a method for producing a semiconductor device acting as a capacitor in accordance with the first embodiment of this invention.

Referring to FIG. 18, the Si wafer under the foregoing process for producing a semiconductor device acting as a capacitor is dipped in a dilute HF of which the HF concentration is 1%, to remove the $SiO_2$ particles (8) remained among the top surface of the conductive polycrystalline Si layer (5) and each grain composing the conductive polycrystalline Si layer (6) having a rugged surface. During this process, the $SiO_2$ layer (7) is partly etched. As a result, the top surface thereof is made concave. By this process, the cause of the drawbacks to be removed by this invention has been removed to realize a result specific to this invention.

Figure 19:
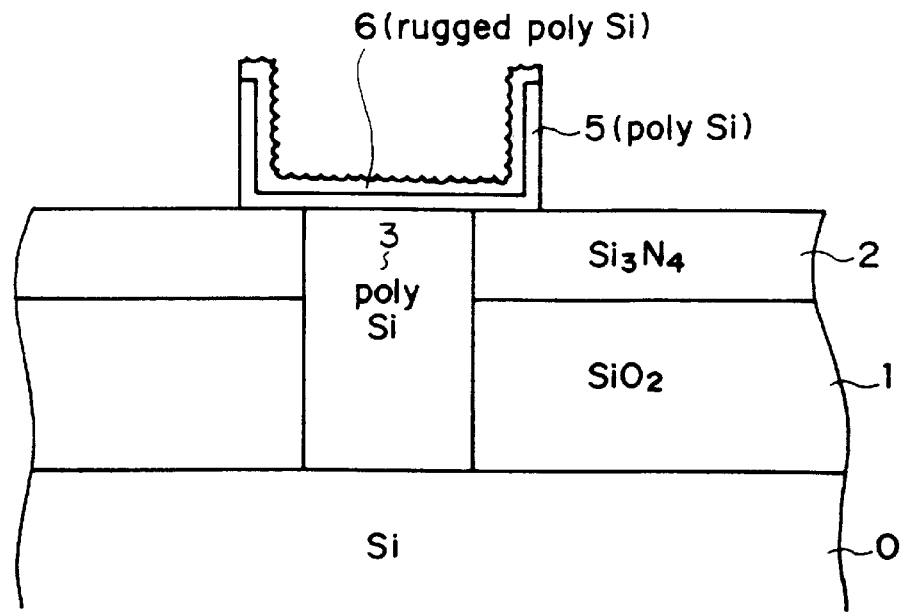
FIG. 19 is a schematic cross section of a semiconductor device acting as a capacitor or a monolithic capacitor under progress of a method for producing a semiconductor device acting as a capacitor in accordance with the first embodiment of this invention.

Referring to FIG. 19, employing the $SiO_2$ layer (7) as an etching mask, an anisotropic etching process is conducted to remove the conductive polycrystalline Si layer (6) having a rugged surface and the conductive polycrystalline Si layer (5) from the top of the $SiO_2$ layer (4). For this process, $Cl_2$ can be employed as the etchant gas.

Figure 8:
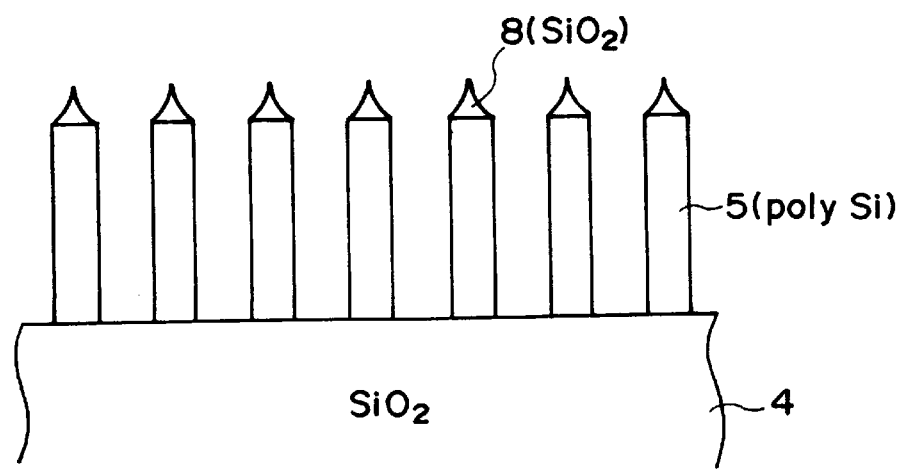
FIG. 8 is a schematic cross section of plural polycrystalline Si pillars remained on an $SiO_2$ layer.
Figure 9:
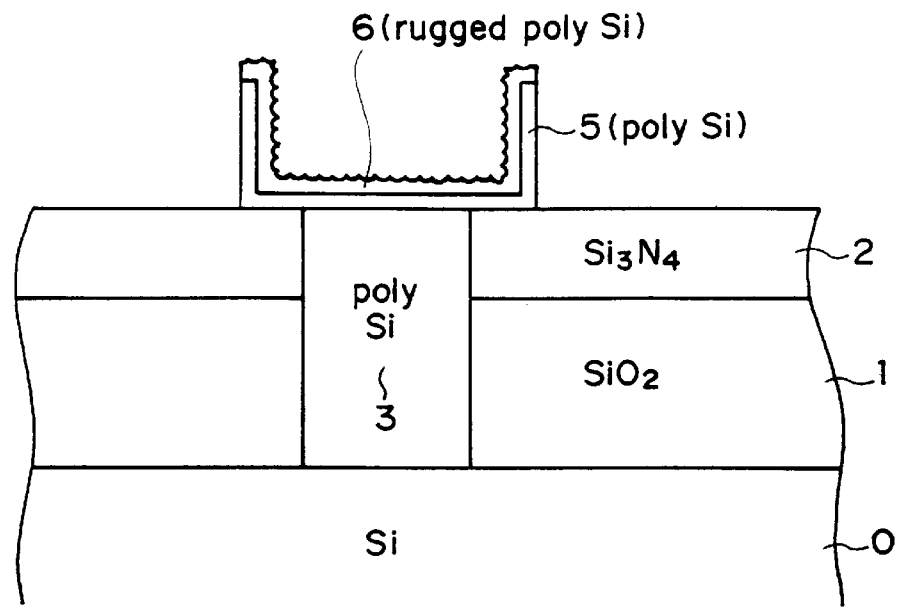
FIG. 9 is a schematic cross section of a semiconductor device acting as a capacitor or a monolithic capacitor under progress of a method for producing a semiconductor device acting as a capacitor available in the prior art.
Figure 10:
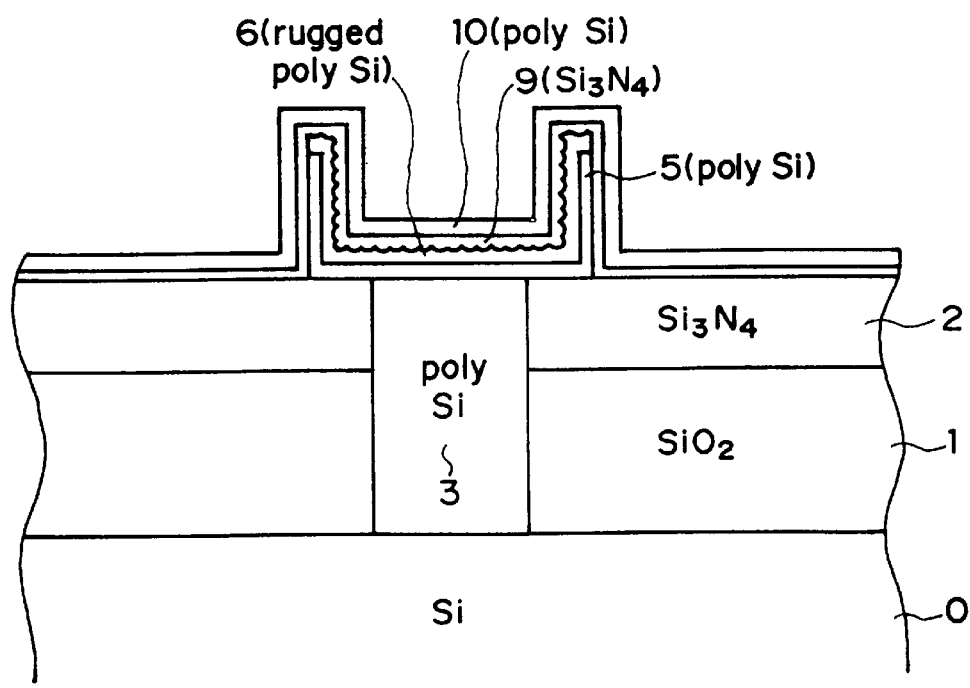
FIG. 10 is a schematic cross section of a semiconductor device acting as a capacitor or a monolithic capacitor produced employing a method for producing a semiconductor device acting as a capacitor available in the prior art.

Since the $SiO_2$ particles (8) were removed in the foregoing process, the plural pillars of the conductive polycrystalline Si layer (5) illustrated in FIG. 8 under the label (5) and which were inevitably produced in the prior art, are not produced in the foregoing step.

An isotropic etching process is conducted to entirely remove the $SiO_2$ layer (7) and the $SiO_2$ layer (4). For this process, the Si wafer under the process for producing a semiconductor device acting as a capacitor can be dipped in a dilute HF of which the HF concentration is 5%. Since the plural pillars of the conductive polycrystalline Si layer (5) illustrated in FIG. 8 under the label (5) and which had inevitably been produced in the prior art, were not produced in the foregoing step, no dust is produced in the foregoing etching process, resultantly causing no results to degrade the throughput of a method for producing a semiconductor device which acts as a capacitor in accordance with this embodiment of this invention, the degradation otherwise being realized when dust is deposited on the Si wafer under the process for producing a semiconductor device acting as a monolithic capacitor available in the prior art.

Produced in this manner is one of the electrodes of a monolithic capacitor, the electrode having the shape of a vertical cylinder having an open end upward and a closed end downward made of a conductive polycrystalline Si layer (5) covered by the conductive polycrystalline Si layer (6) having a rugged surface, and resultantly having a large magnitude of the surface area thereof.

Figure 20:
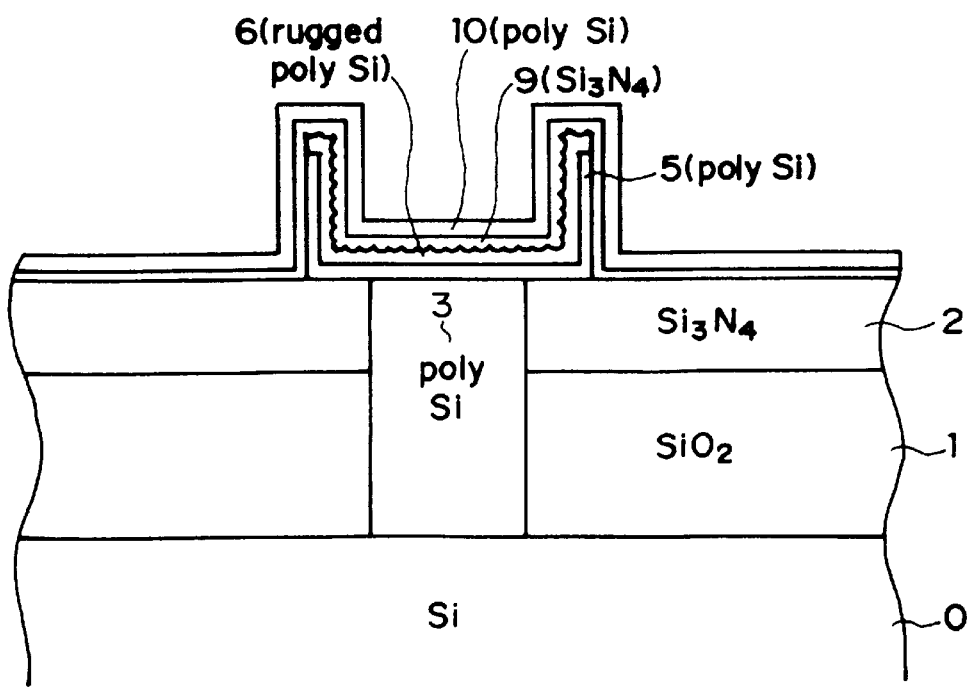
FIG. 20 is a schematic cross section of a semiconductor device acting as a capacitor or a monolithic capacitor produced employing a method for producing a semiconductor device acting as a capacitor in accordance with the first embodiment of this invention.

Referring to FIG. 20, a rapid thermal nitridation process is conducted for 30 sec. in the atmosphere of $NH_3$ of 850° C., before a CVD process is conducted to produce an $Si_3N_4$ layer (9) having a thickness of 3 through 4 nm. An oxidation process is conducted for 20 sec. in the atmosphere of steam of 900° C. to enhance the resistively of the $Si_3N_4$ layer (9).

A CVD process is conducted to produce a conductive polycrystalline Si layer (10) to cover the $Si_3N_4$ layer (9). The conductivity of the $Si_3N_4$ layer (9) is free. The concentration of the impurity doped in the $Si_3N_4$ layer (9) can be $5 \times 10^{20}$ cm$^{-3}$. Needless to emphasize, the conductive polycrystalline Si layer (10) is extended to produce an electrode of a terminal of the monolithic capacitor produced by the foregoing series of steps. As the final step, a passivation process is conducted.

Since the $SiO_2$ particles (8) are removed, before a step for removing the conductive polycrystalline Si layer (6) having a rugged surface and the conductive polycrystalline Si layer (5), no dust is produced during the process for removing the $SiO_2$ layer (7). As a result, there is no possibility in which dust is deposited on the surface of an Si wafer under the process for producing a semiconductor device acting as a monolithic capacitor. As a final result, a good grade of throughput is achieved by the method for producing a semiconductor device acting as a capacitor in accordance with this embodiment of this invention.

Second Embodiment

A method for producing a semiconductor device acting as a monolithic capacitor, the method having a step for producing an $SiO_2$ layer on a conductive polycrystalline Si layer having a rugged surface by employing a CVD process which CVD process employs thermal decomposition of TEOS ($Si(C_2H_5O)_4$) in an excess volume of $O_3$ (An exemplary volumetric ratio of $O_3$ and TEOS is 10.5:1), before a process for removing the conductive polycrystalline Si later having a rugged surface from the area on which the monolithic capacitor is not produced. Since the CVD process scarcely produces $SiO_2$ particles among the top surface of an under layer on which the conductive polycrystalline Si layer having a rugged surface is produced, and each grain composing the conductive polycrystalline Si layer having a rugged surface, the method for producing a semiconductor device acting as a monolithic capacitor of this embodiment is entirely free from the problem caused by dust which is further caused by pillars of polycrystalline Si layers.

Figure 21:
FIG. 21 is a schematic cross section of a semiconductor device acting as a capacitor or a monolithic capacitor under progress of a method for producing a semiconductor device acting as a capacitor in accordance with the second embodiment of this invention.

Referring to FIG. 21, a CVD process is conducted to produce an $SiO_2$ layer (1) having an approximate thickness of 800 nm on a conductive Si substrate (0). A CVD process is conducted to produce an $Si_3N_4$ layer (2) having an approximate thickness of 100 nm on the $SiO_2$ layer (1).

Figure 22:
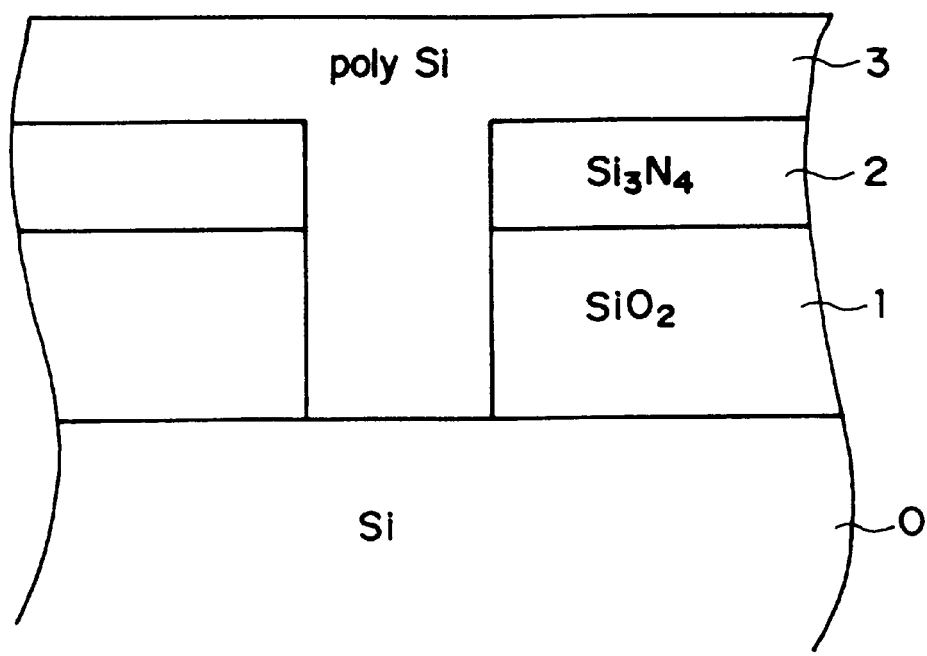
FIG. 22 is a schematic cross section of a semiconductor device acting as a capacitor or a monolithic capacitor under progress of a method for producing a semiconductor device acting as a capacitor in accordance with the second embodiment of this invention.

Referring to FIG. 22, a photo lithography process is conducted to produce a recess having an approximate diameter of 200 nm and an approximate depth of 900 nm from the top surface of the $Si_3N_4$ layer (2). An anisotropic etching process is employed to etch the $Si_3N_4$ layer (2) and the $SiO_2$ layer (1) from a selected area remained uncovered by a photo resist mask. A mixture of $C_4F_8$, CO, Ar and $O_2$ can be employed as the etchant gas. As a result, the top surface of the conductive Si substrate (0) is exposed at a location corresponding to the recess. A CVD process is conducted to produce a polycrystalline Si layer (3) containing an impurity having a conductivity identical to that of the Si substrate (0) to an approximate concentration of $5\times10^{20}$ cm$^{-3}$, on the $Si_3N_4$ layer (2), which resultantly buries the recess produced in the foregoing process. The thickness of the conductive polycrystalline Si layer (3) is approximately 300 nm on top of the surface of the $Si_3N_4$ layer (2).

Figure 23:
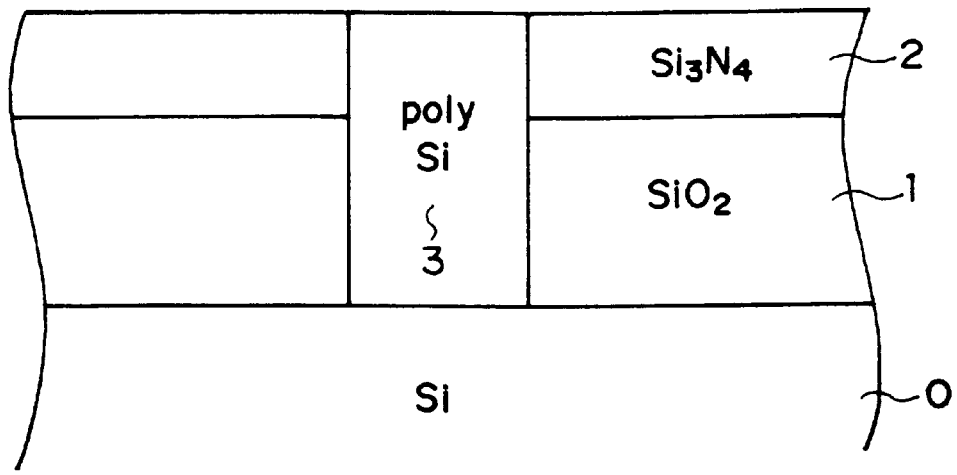
FIG. 23 is a schematic cross section of a semiconductor device acting as a capacitor or a monolithic capacitor under progress of a method for producing a semiconductor device acting as a capacitor in accordance with the second embodiment of this invention.

Referring to FIG. 23, the conductive polycrystalline Si layer (3) is etch-backed to expose the top surface of the $Si_3N_4$ layer (2). $Cl_2$ can be employed as the etchant gas. In this manner, the conductive polycrystalline Si layer (3) is remained in the recess in the shape of a conductive plug electrically connected with the conductive Si substrate (0).

Figure 24:
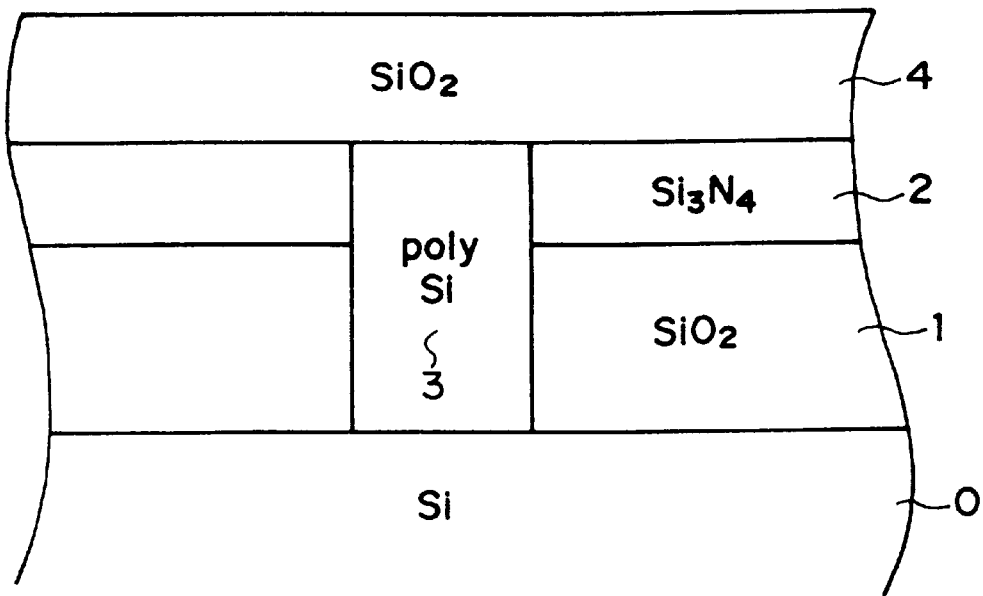
FIG. 24 is a schematic cross section of a semiconductor device acting as a capacitor or a monolithic capacitor under progress of a method for producing a semiconductor device acting as a capacitor in accordance with the second embodiment of this invention.

Referring to FIG. 24, a CVD process is conducted to produce an $SiO_2$ layer (4) having an approximate thickness of 600 nm on the $Si_3N_4$ layer (2) and the conductive Si plug (3).

Referring to FIG. 25, a photo lithography process is conducted to produce a recess having an approximate diameter of 300 through 500 nm and an approximate depth of 300 nm from the top surface of the $SiO_2$ layer (4). As a result, the top surface of the plug-shaped conductive polycrystalline Si layer (3) is exposed. A CVD process is conducted to produce a polycrystalline Si layer (5) containing an impurity having a conductivity identical to that which is contained in the conductive polycrystalline Si plug (3) to an approximate concentration of $5\times10^{20}$ cm$^{-3}$ and having an approximate thickness of 50 nm, on top of the conductive polycrystalline Si plug (3) and the $SiO_2$ layer (4). Further, an LPCVD process is conducted in $SiH_4$ at a pressure of 0.2 torr and at a temperature of 570° C. to produce a conductive polycrystalline Si layer (6) having a rugged surface and having an approximate thickness of 50 nm on top of the conductive polycrystalline Si layer (5). As was described earlier, the production of the rugged surface is caused by coexistence of amorphous regions and polycrystalline grains in the conductive polycrystalline Si layer having a rugged surface (6) in which an amorphous phase is transiting to a polycrystalline phase.

Figure 1:
FIG. 1 is a schematic cross section of a semiconductor device acting as a capacitor or a monolithic capacitor under progress of a method for producing a semiconductor device acting as a capacitor available in the prior art.
Figure 2:
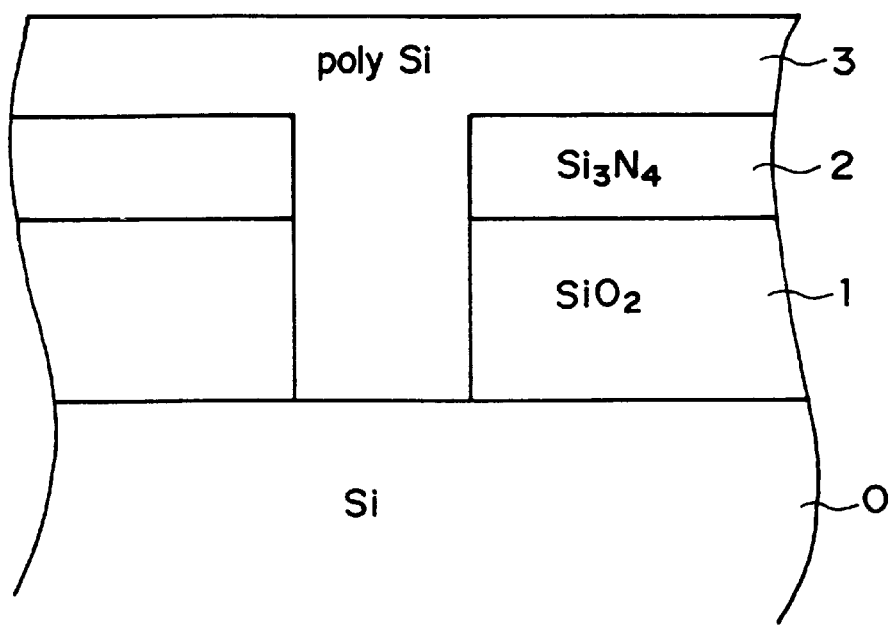
FIG. 2 is a schematic cross section of a semiconductor device acting as a capacitor or a monolithic capacitor under progress of a method for producing a semiconductor device acting as a capacitor available in the prior art.
Figure 3:
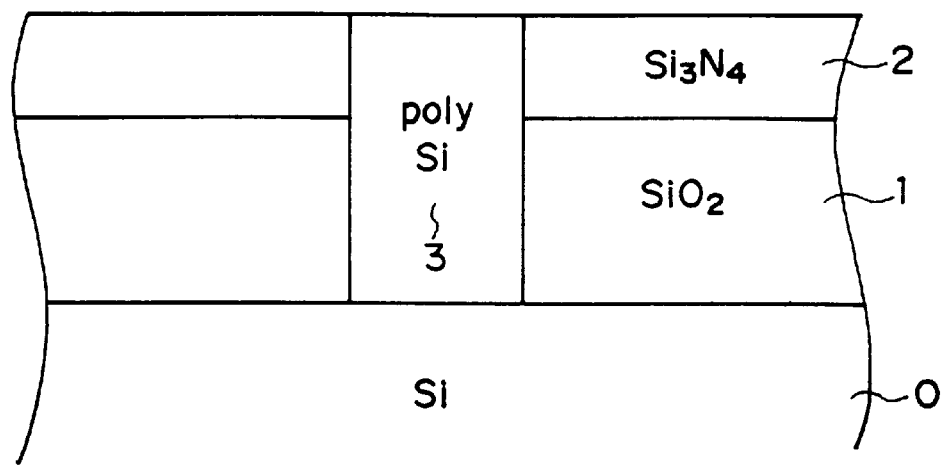
FIG. 3 is a schematic cross section of a semiconductor device acting as a capacitor or a monolithic capacitor under progress of a method for producing a semiconductor device acting as a capacitor available in the prior art.
Figure 4:
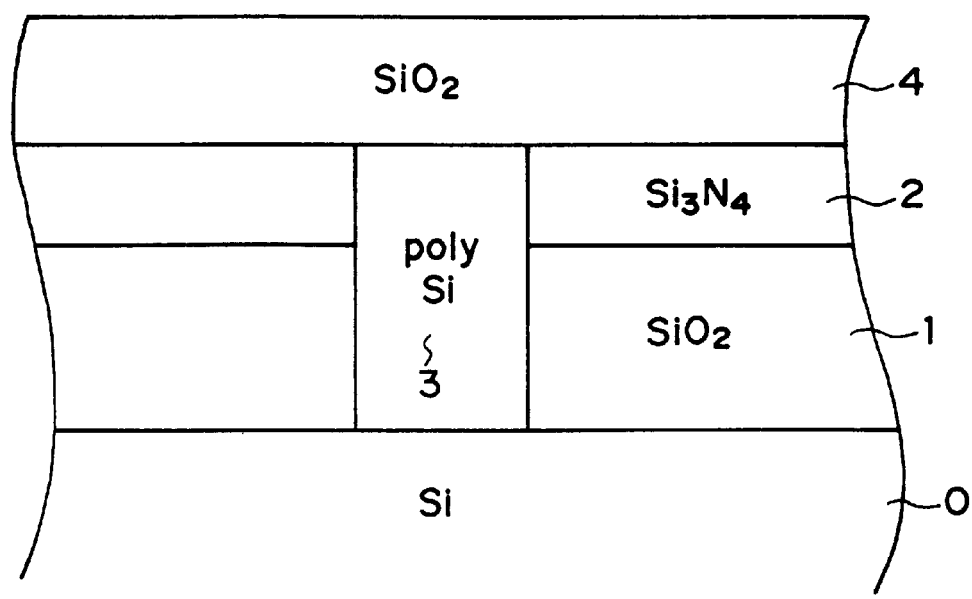
FIG. 4 is a schematic cross section of a semiconductor device acting as a capacitor or a monolithic capacitor under progress of a method for producing a semiconductor device acting as a capacitor available in the prior art.
Figure 5:
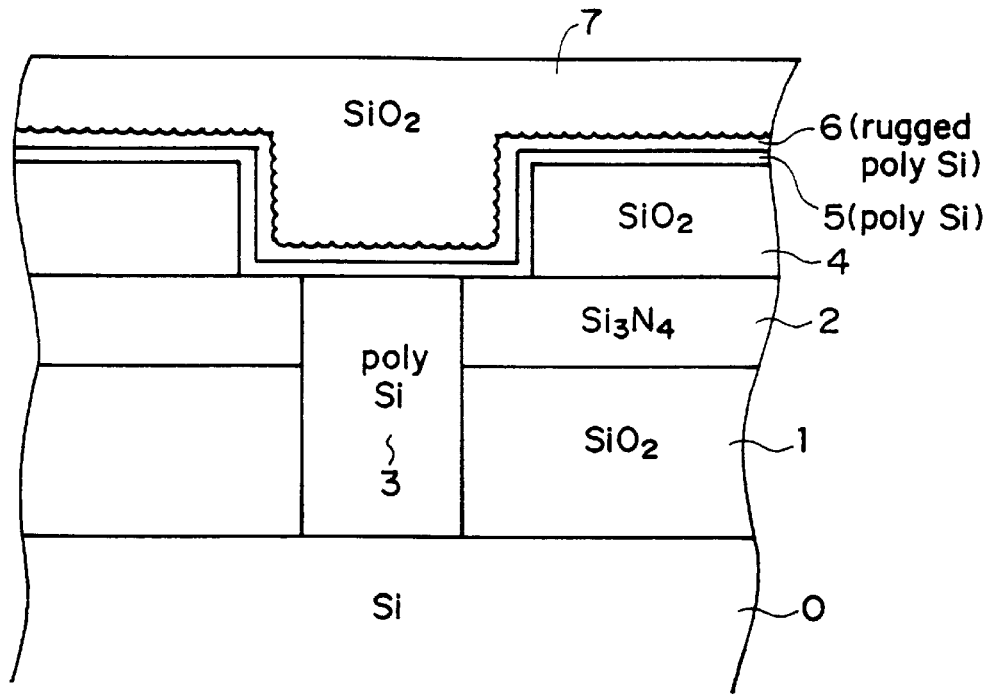
FIG. 5 is a schematic cross section of a semiconductor device acting as a capacitor or a monolithic capacitor under progress of a method for producing a semiconductor device acting as a capacitor available in the prior art.
Figure 6:
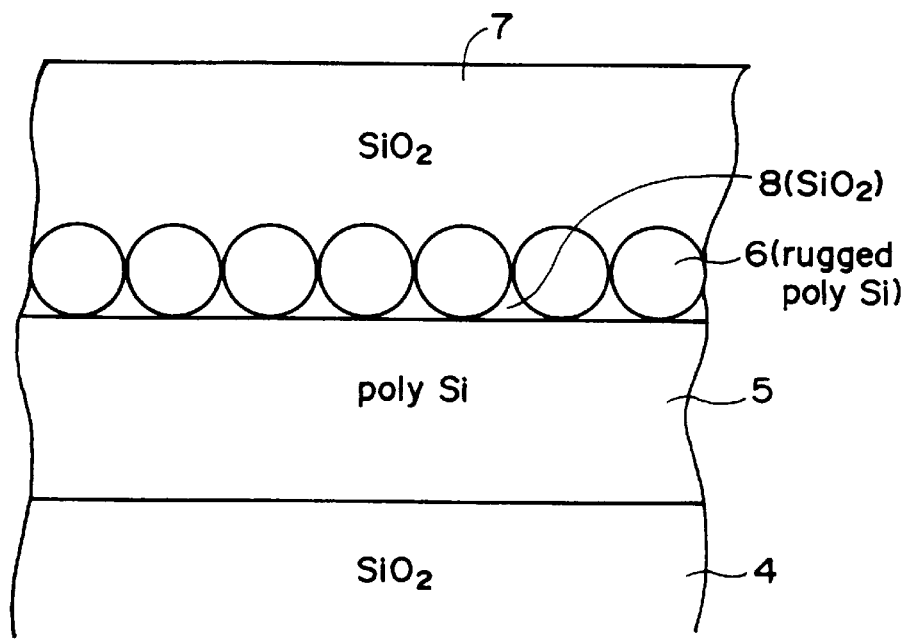
FIG. 6 is a schematic cross section of a polycrystalline Si layer having a rugged surface covered by an $SiO_2$ layer, remaining $SiO_2$ particles in space between grains of the polycrystalline Si layer having a rugged surface and a polycrystalline Si layer on which the polycrystalline Si layer having a rugged surface is produced.
Figure 7:
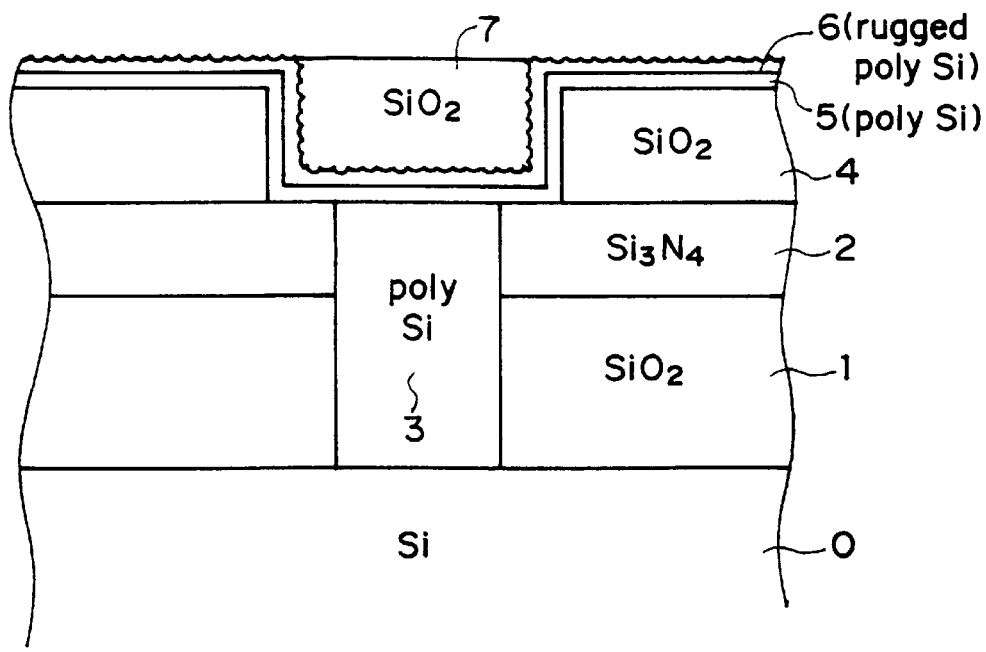
FIG. 7 is a schematic cross section of a semiconductor device acting as a capacitor or a monolithic capacitor under progress of a method for producing a semiconductor device acting as a capacitor available in the prior art.

A CVD process which is based on thermal decomposition of tetraethylorthosilicate (TEOS) having the chemical formula of Si $(C_2H_5O)_4$ in the atmosphere of $O_3$ (or employing a mixture of $O_3$ and TEOS in the ratio of 10.5:1 as the reaction gas), is conducted to produce an $SiO_2$ layer (7a) having an approximate thickness of 400 nm on top of the conductive polycrystalline Si layer (6) having a rugged surface. During the foregoing CVD process, $SiO_2$ particles (8) illustrated in FIG. 6 are not produced among the top surface of the conductive polycrystalline Si layer (5) and each grain composing the conductive polycrystalline (6) having a rugged surface, because the concentration of $O_3$ contained in the reaction gas is 3 through 4 times as much as that of the usual case, in which a reaction gas containing $O_3$ and TEOS in a volumetric ratio of 2.0:1. This eliminates production of the plural pillars of the conductive polycrystalline Si layer (5) illustrated in FIG. 8 under the label (5), during the process for removing the conductive polycrystalline Si layer (6) having a rugged surface and the conductive polycrystalline Si layer (5), resultantly eliminating the possibility in which dust is produced during the process for removing the $SiO_2$ layer (4), which dust reduces the throughput of the method for producing a semiconductor device acting as a capacitor, when it is deposited on the Si wafer under the process for producing a semiconductor device acting as a monolithic capacitor.

Referring to FIG. 26, an anisotropic etching process is conducted to etch-back the $SiO_2$ layer (7a) until the conductive polycrystalline Si layer (6) having a rugged surface is exposed. A mixture of $CF_4$, $CHF_3$ and Ar can be employed as the etching gas.

Figure 27:
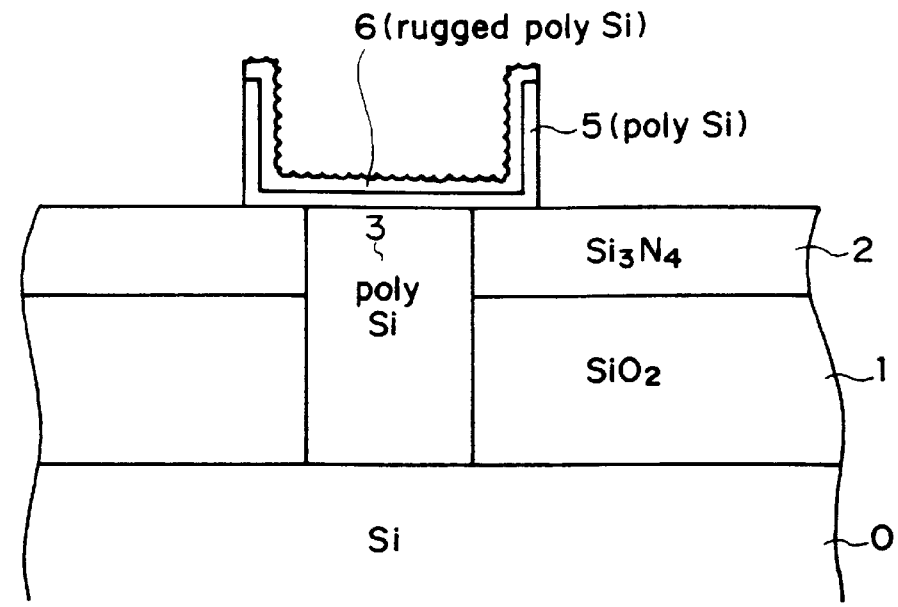
FIG. 27 is a schematic cross section of a semiconductor device acting as a capacitor or a monolithic capacitor under progress of a method for producing a semiconductor device acting as a capacitor in accordance with the second embodiment of this invention.

Referring to FIG. 27, employing the $SiO_2$ layer (7a) as an etching mask, an anisotropic etching process is conducted to remove the conductive polycrystalline Si layer (6) having a rugged surface and the conductive polycrystalline Si layer (5) from the top of the $SiO_2$ layer (4). For this process, $Cl_2$ can be employed as the etching gas. The Si wafer under the foregoing process for producing a semiconductor device acting as a capacitor is dipped in a dilute HF of which the HF concentration is 5% to remove the $SiO_2$ layer (7a) and the $SiO_2$ layer (4).

Figure 28:
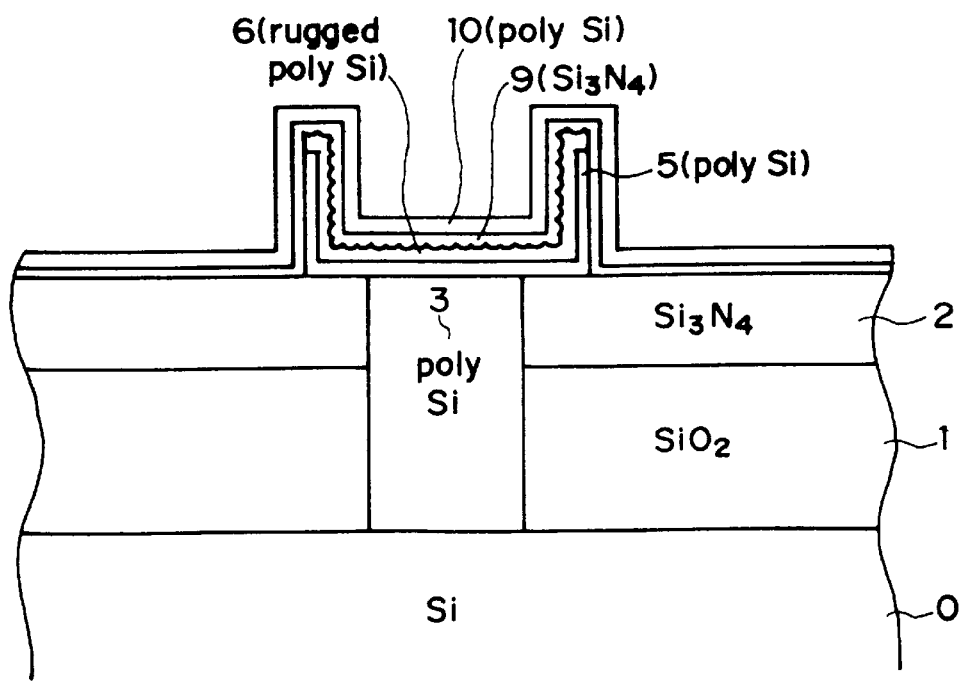
FIG. 28 is a schematic cross section of a semiconductor device acting as a capacitor or a monolithic capacitor produced employing a method for producing a semiconductor device acting as a capacitor in accordance with the second embodiment of this invention.

Referring to FIG. 28, a rapid thermal nitridation process is conducted for 30 sec. in the atmosphere of $NH_3$ of 850° C., before a CVD process is conducted to produce an $Si_3N_4$ layer (9) having a thickness of 3 through 4 nm. An oxidation process is conducted for 20 sec. in the atmosphere of steam of 900° C. to enhance the resistively of the $Si_3N_4$ layer (9).

A CVD process is conducted to produce a conductive polycrystalline Si layer (10) to cover the $Si_3N_4$ layer (9). The conductivity of the $Si_3N_4$ layer (9) is free. The concentration of the impurity doped in the $Si_3N_4$ layer (9) can be $5\times10^{20}$ cm$^{-3}$. Needless to emphasize, the conductive polycrystalline Si layer (10) is extended to produce an electrode of a terminal of the monolithic capacitor produced by the foregoing series of steps.

As the final step, a passivation process is conducted.

Since a CVD process employing a mixture of $O_3$ and TEOS ($Si(C_2H_5O)_4$) in the ratio of 10.5:1 as the reaction gas, is employed to produce the $SiO_2$ layer (7a), $SiO_2$ particles (8) illustrated in FIG. 6 are not produced among the top surface of the conductive polycrystalline Si layer (5) and each grain composing the conductive polycrystalline (6) having a rugged surface. As a result, no dust is produced during the process for removing the $SiO_2$ layer (7) and a good grade of throughput is achieved by the method for producing a semiconductor device acting as a capacitor in accordance with this embodiment of this invention.

Third Embodiment

A method for producing a semiconductor device acting as a monolithic capacitor, the method eliminating a step for producing a conductive polycrystalline Si layer under a conductive polycrystalline Si layer having a rugged surface, resultantly eliminating a possibility in which dust is produced during a step for removing the under-layer of the conductive polycrystalline Si layer.

Figure 29:
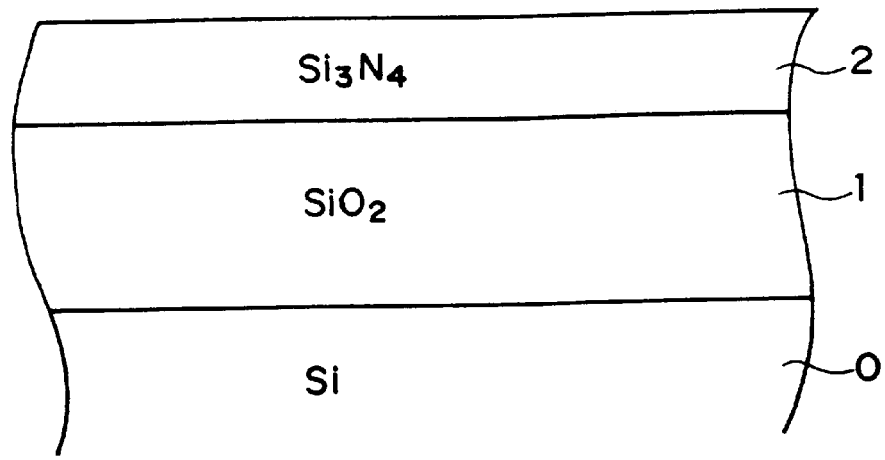
FIG. 29 is a schematic cross section of a semiconductor device acting as a capacitor or a monolithic capacitor under progress of a method for producing a semiconductor device acting as a capacitor in accordance with the third embodiment of this invention.

Referring to FIG. 29, a CVD process is conducted to produce an $SiO_2$ layer (1) having an approximate thickness of 800 nm on a conductive Si substrate (0). A CVD process is conducted to produce an $Si_3N_4$ layer (2) having an approximate thickness of 100 nm on the $SiO_2$ layer (1).

Figure 30:
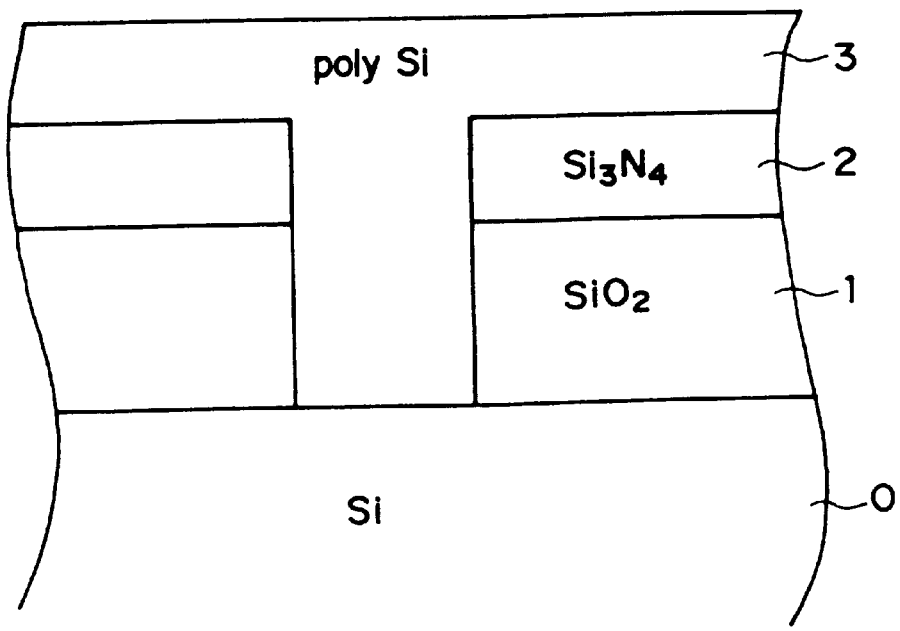
FIG. 30 is a schematic cross section of a semiconductor device acting as a capacitor or a monolithic capacitor under progress of a method for producing a semiconductor device acting as a capacitor in accordance with the third embodiment of this invention.

Referring to FIG. 30, a photo lithography process is conducted to produce a recess having an approximate diameter of 200 nm and an approximate depth of 900 nm from the top surface of the $Si_3N_4$ layer (2). For this process an anisotropic etching process is employed to etch the $Si_3N_4$ layer (2) and the $SiO_2$ layer (1) from a selected area remained uncovered by a photo resist mask. A mixture of $C_4F_8$, CO; Ar and $O_2$ can be employed as the etching gas. As a result, the top surface of the conductive Si substrate (0) is exposed at a location corresponding to the recess. A CVD process is conducted to produce a polycrystalline Si layer (3) containing an impurity having a conductivity identical to that of the Si substrate (0) to an approximate concentration of $5 \times 10^{20}$ $cm^{-3}$, on the $Si_3N_4$ layer (2), which resultantly buries the recess produced in the foregoing process. The thickness of the conductive polycrystalline Si layer (3) is approximately 300 nm on top of the surface of the $Si_3N_4$ layer (2).

Figure 31:
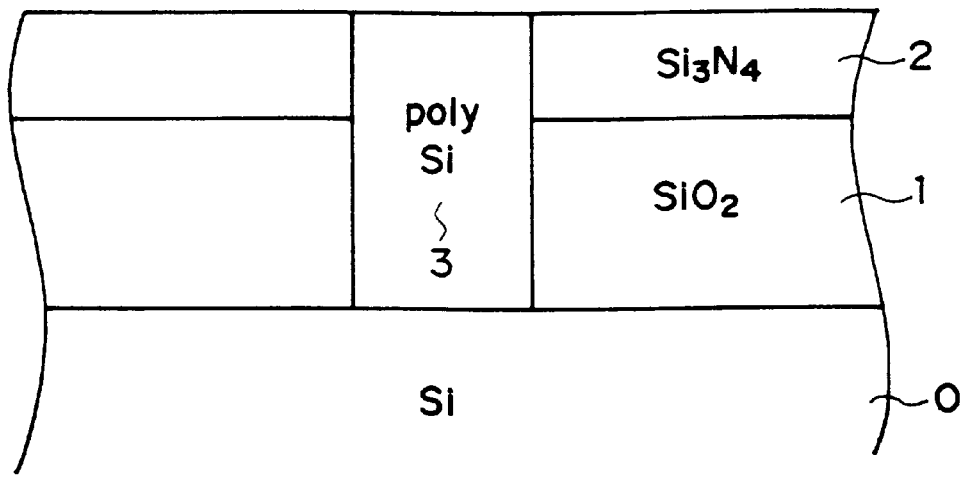
FIG. 31 is a schematic cross section of a semiconductor device acting as a capacitor or a monolithic capacitor under progress of a method for producing a semiconductor device acting as a capacitor in accordance with the third embodiment of this invention.

Referring to FIG. 31, the conductive polycrystalline Si layer (3) is etch-backed to expose the top surface of the $Si_3N_4$ layer (2). $Cl_2$ can be employed as the etchant gas. In this manner, the conductive polycrystalline Si layer (3) is remained in the recess in the shape of a conductive plug electrically connected with the conductive Si substrate (0).

Figure 32:
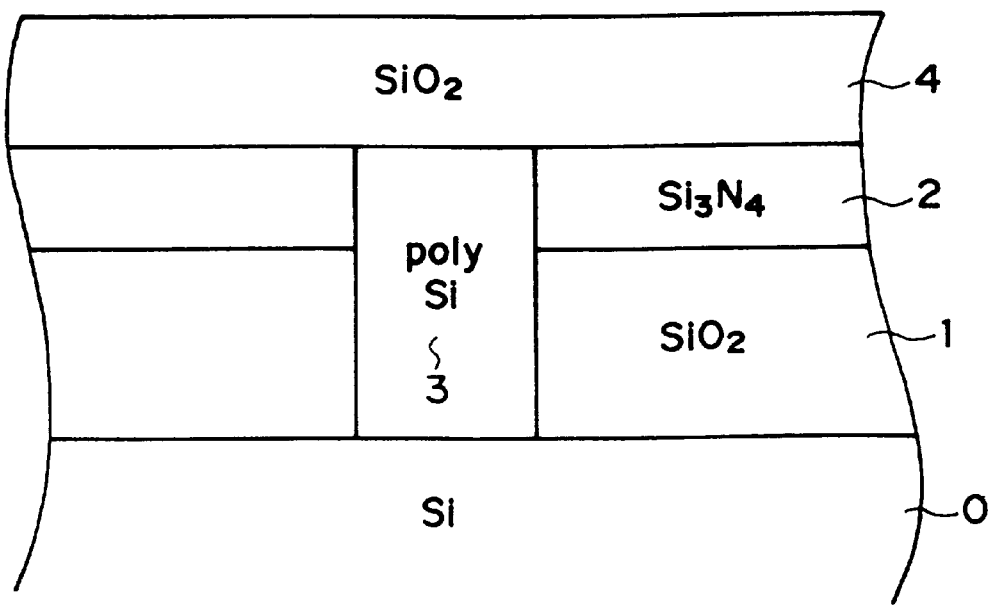
FIG. 32 is a schematic cross section of a semiconductor device acting as a capacitor or a monolithic capacitor under progress of a method for producing a semiconductor device acting as a capacitor in accordance with the third embodiment of this invention.

Referring to FIG. 32, a CVD process is conducted to produce an $SiO_2$ layer (4) having an approximate thickness of 600 nm on the $Si_3N_4$ layer (2) and the conductive Si plug (3).

Figure 33:
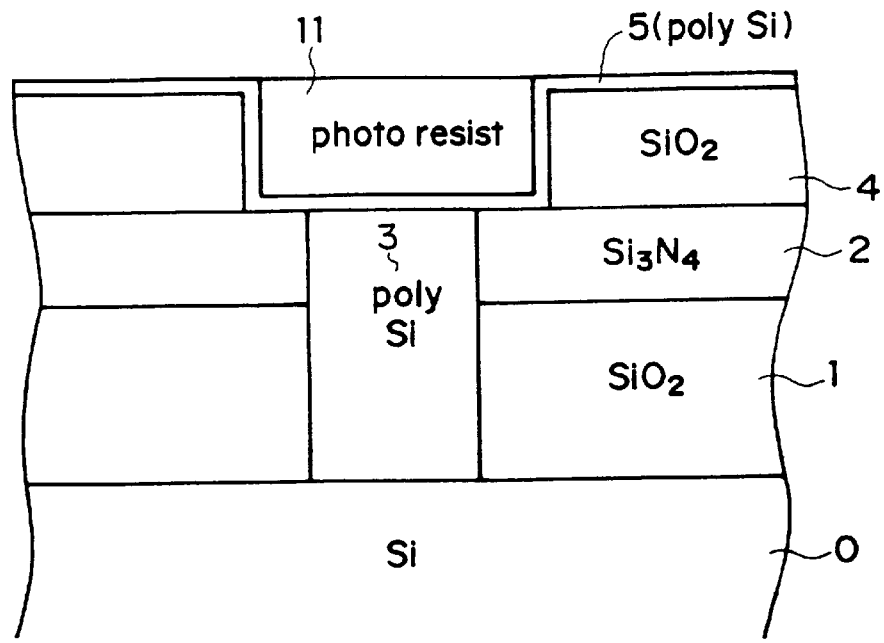
FIG. 33 is a schematic cross section of a semiconductor device acting as a capacitor or a monolithic capacitor under progress of a method for producing a semiconductor device acting as a capacitor in accordance with the third embodiment of this invention.

Referring to FIG. 33, a photo lithography process is conducted to produce a recess having an approximate diameter of 300 through 500 nm and an approximate depth of 300 nm from the top surface of the $SiO_2$ layer (4). For this purpose, a mixture of $CF_4$, $CHF_3$, and Ar can be employed as the etchant gas. As a result, the top surface of the plug-shaped conductive polycrystalline Si layer (3) is exposed. A CVD process is conducted to produce a polycrystalline Si layer (5) containing an impurity having a conductivity identical to that which is contained in the conductive polycrystalline Si plug (3) to an approximate concentration of $5 \times 10^{20}$ $cm^{-3}$ and having an approximate thickness of 50 nm, on top of the conductive polycrystalline Si plug (3) and the $SiO_2$ layer (4). A photo resist is spin coated in the foregoing recess and on the $SiO_2$ layer (4), before it is etch-backed until the top surface of the polycrystalline Si layer (5) to remain a photo resist layer (11) in the foregoing recess. The photo resist layer (11) is remained unexposed. A posi photo resist containing a copolymer of polyhydroxystyrene and tributoxycarbonylpolyhydroxystyrene or a photo resist containing a copolymer of polyhydroxystyrene and methacrylate can be employed for this purpose.

Figure 34:
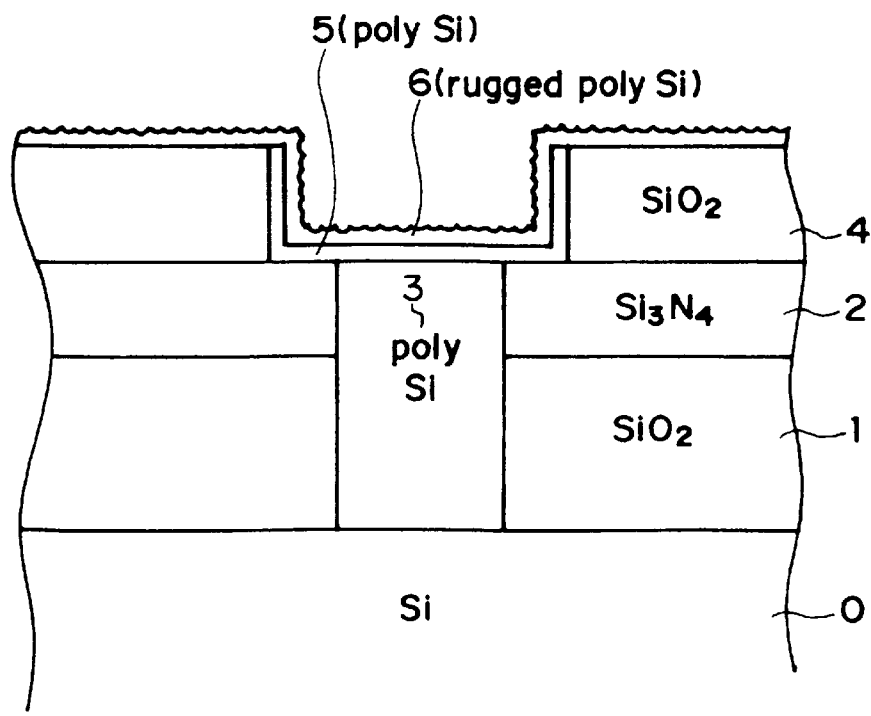
FIG. 34 is a schematic cross section of a semiconductor device acting as a capacitor or a monolithic capacitor under progress of a method for producing a semiconductor device acting as a capacitor in accordance with the third embodiment of this invention.

Referring to FIG. 34, an anisotropic etching process is conducted to remove the conductive polycrystalline Si layer (5) from the top surface of the $SiO_2$ layer (4), remaining the conductive polycrystalline Si layer (5) in the recess. A mixture of $CH_4$, $CHF_3$ and Ar can be employed as the etchant gas for this process. After the photo resist layer (11) which was employed as the etching mask in the foregoing etching process, is removed, an LPCVD process is conducted at a temperature of 570° C. and in an atmosphere of $SiH_4$ at the pressure of 0.2 torr to produce a conductive Si layer (6) having a rugged surface having an approximate thickness of 50 nm on top of the conductive polycrystalline Si layer (5) and the $SiO_2$ layer (4). As was described earlier, the production of the rugged surface is caused by coexistence of amorphous regions and polycrystalline grains in the conductive polycrystalline Si (6) having a rugged surface in which an amorphous phase is transiting to a polycrystalline phase.

Figure 35:
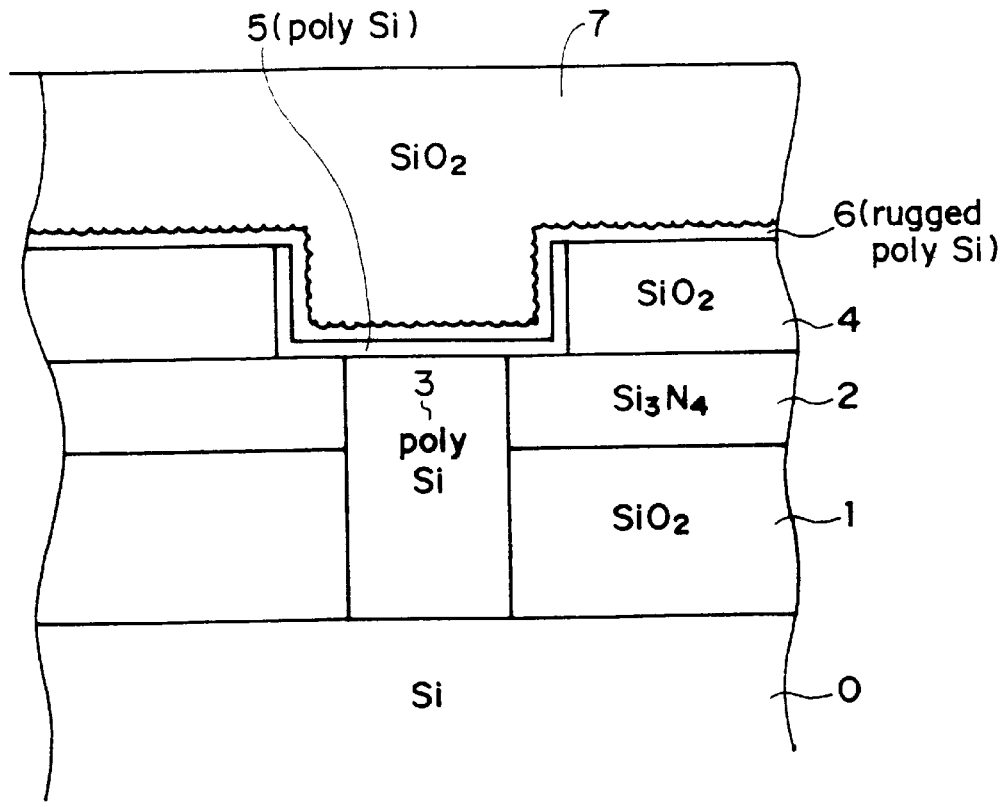
FIG. 35 is a schematic cross section of a semiconductor device acting as a capacitor or a monolithic capacitor under progress of a method for producing a semiconductor device acting as a capacitor in accordance with the third embodiment of this invention.

Referring to FIG. 35, a CVD process is conducted to produce an $SiO_2$ layer (7) having an approximate thickness of 400 nm on top of the conductive polycrystalline Si layer (6) having a rugged surface. During the foregoing process, $SiO_2$ particles illustrated in FIG. 6 by the label (8) are deposited in space remained among the top surface of the $SiO_2$ layer (4) and each gain composing the conductive polycrystalline Si layer (6) having a rugged surface, during the foregoing process for producing the $SiO_2$ layer (7).

Figure 36:
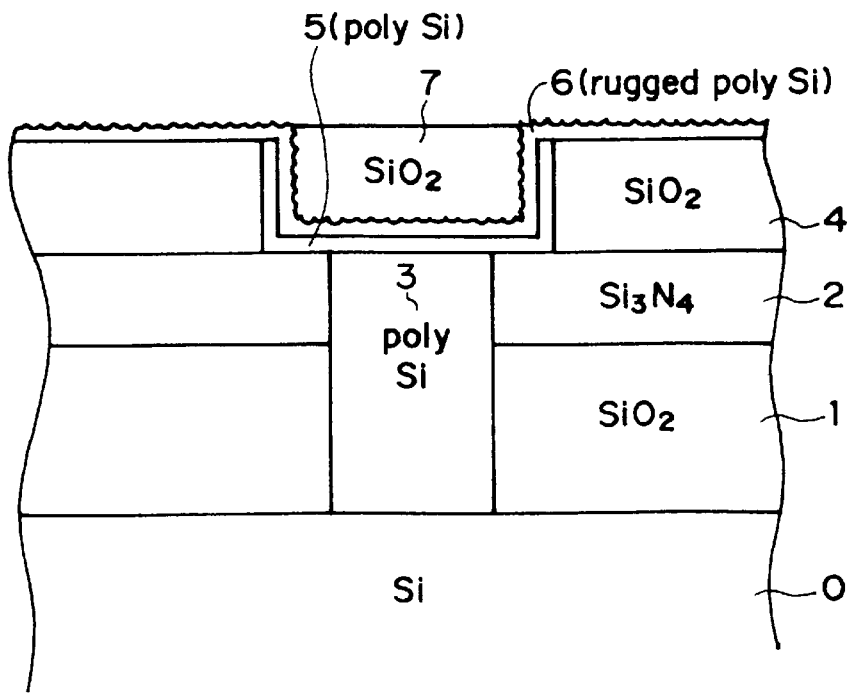
FIG. 36 is a schematic cross section of a semiconductor device acting as a capacitor or a monolithic capacitor under progress of a method for producing a semiconductor device acting as a capacitor in accordance with the third embodiment of this invention.

Referring to FIG. 36 an anisotropic etching process is conducted to etch-back the $SiO_2$ layer (7) until the conductive polycrystalline Si layer (6) having a rugged surface is exposed. A mixture of $CF_4$, $CHF_3$ and Ar can be employed as the etchant gas.

Figure 37:
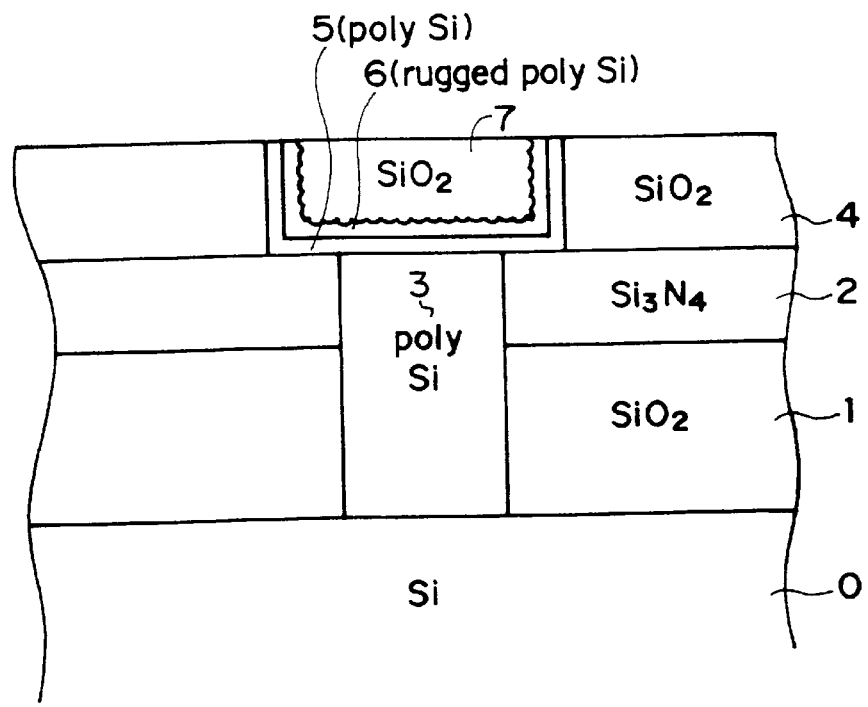
FIG. 37 is a schematic cross section of a semiconductor device acting as a capacitor or a monolithic capacitor under progress of a method for producing a semiconductor device acting as a capacitor in accordance with the third embodiment of this invention.

Referring to FIG. 37, an anisotropic etching process is conducted to remove the conductive polycrystalline Si layer (6) having a rugged surface from the top of the $SiO_2$ layer (4). For this process, $Cl_2$ can be employed as the etchant gas.

Figure 38:
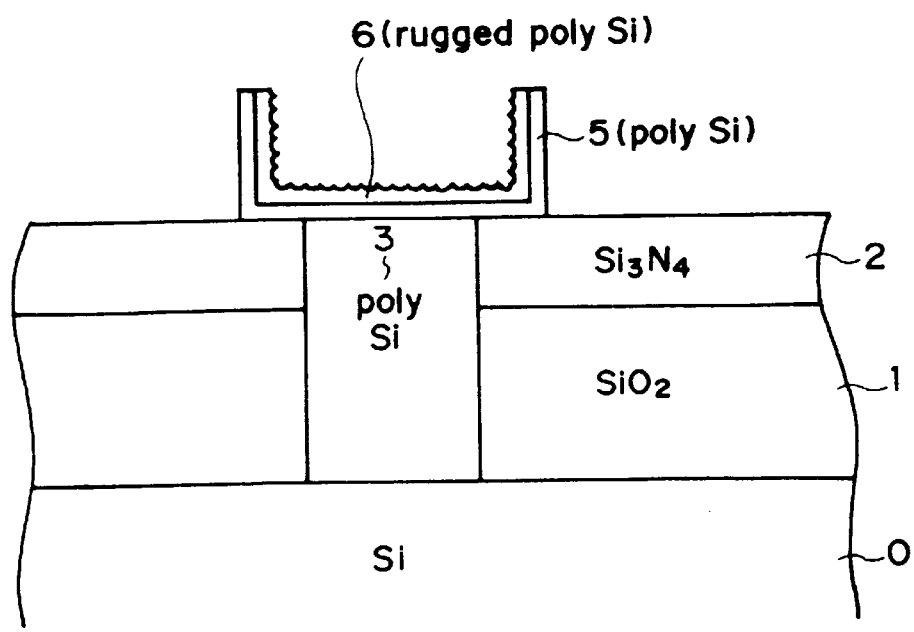
FIG. 38 is a schematic cross section of a semiconductor device acting as a capacitor or a monolithic capacitor under progress of a method for producing a semiconductor device acting as a capacitor in accordance with the third embodiment of this invention.

Referring to FIG. 38, the Si wafer under the foregoing process for producing a semiconductor device acting as a monolithic capacitor is dipped in a dilute HF of which the HF concentration is 5% to remove the $SiO_2$ layer (7) and the $SiO_2$ layer (4).

Figure 39:
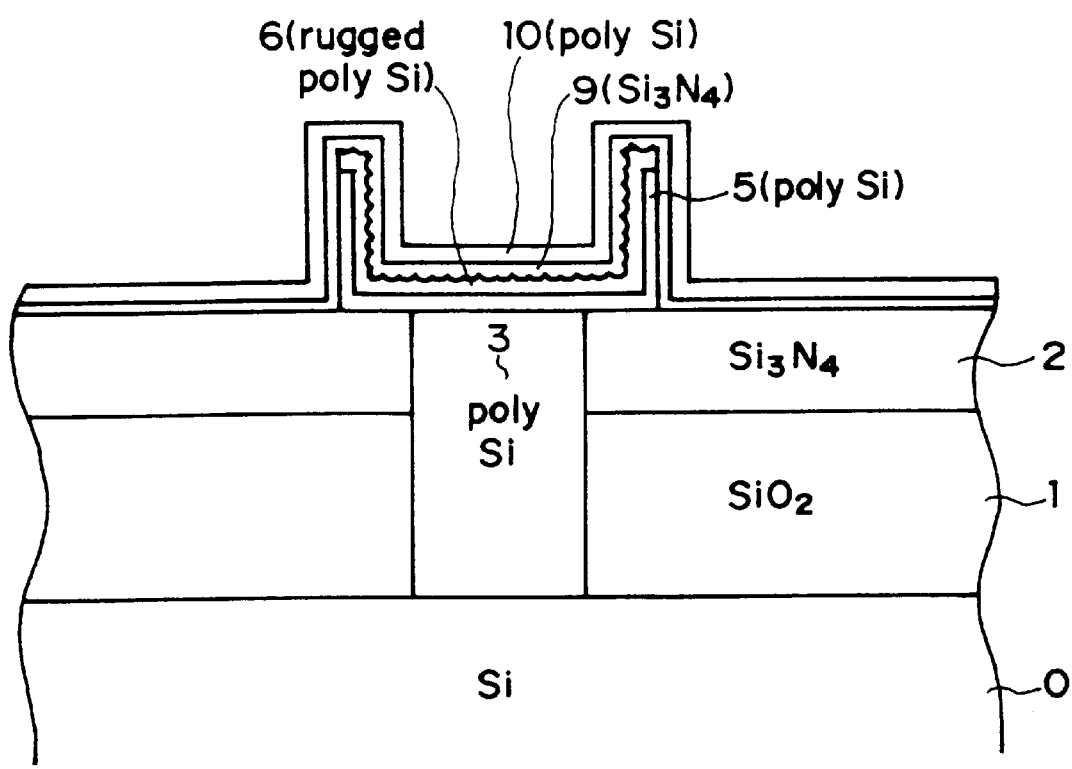
FIG. 39 is a schematic cross section of a semiconductor device acting as a capacitor or a monolithic capacitor produced employing a method for producing a semiconductor device acting as a capacitor in accordance with the third embodiment of this invention.

Referring to FIG. 39, a rapid thermal nitridation process is conducted for 30 sec. in the atmosphere of $NH_3$ of 850° C., before a CVD process is conducted to produce an $Si_3N_4$ layer (9) having a thickness of 3 through 4 nm. An oxidation process is conducted for 20 sec. in the atmosphere of steam of 900° C. to enhance the resistively of the $Si_3N_4$ layer (9).

A CVD process is conducted to produce a conductive polycrystalline Si layer (10) to cover the $Si_3N_4$ layer (9). The conductivity of the $Si_3N_4$ layer (9) is free. The concentration of the impurity doped in the $Si_3N_4$ layer (9) can be $5 \times 10^{20}$ $cm^{-3}$. Needless to emphasize, the conductive polycrystalline Si layer (10) is extended to produce an electrode of a terminal of the monolithic capacitor produced by the foregoing series of steps.

As the final step, a passivation process is conducted.

Since a step for producing a conductive polycrystalline Si layer (5) under a conductive polycrystalline Si layer having a rugged surface (6) is eliminated in the methods for producing a semiconductor device which acts as a monolithic capacitor in accordance with this embodiment of this invention, a possibility for producing dust is eliminated, resultantly improving the throughput of the method for producing a semiconductor device acting as a capacitor in accordance with this embodiment of this invention, because there is no possibility in which the dust which is otherwise inevitably deposited on the surface of the Si wafer during the process for removing the $SiO_2$ layer (4), is produced.

The foregoing description has clarified that this invention has successfully provided three independent methods for producing a semiconductor device which acts as a monolithic capacitor, which can enjoy a good magnitude of the throughput realized by eliminating possibilities in which dust is produced during the process to be deposited again on the surface of a semiconductor wafer.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A method for producing a semiconductor device which acts as a capacitor comprising:

producing a plug-shaped conductive semiconductor layer on a conductive semiconductor substrate, said plug-shaped conductive semiconductor layer being surrounded by an insulator layer, producing a semiconductor oxide layer on said insulator layer, said semiconductor oxide layer having an opening at a location corresponding to said plug-shaped conductive semiconductor layer, producing a conductive semiconductor layer and a conductive semiconductor layer having a rugged surface on said plug-shaped conductive semiconductor layer and said semiconductor oxide layer, producing an etching mask layer on said conductive semiconductor layer having a rugged surface, etching back said etching mask layer until a top surface of said conductive semiconductor layer having a rugged surface is exposed, to convert said etching mask layer to an etching mask, causing said conductive semiconductor layer having a rugged surface to contact an etchant reactive with a semiconductor oxide, to remove semiconductor oxide particles deposited in space remained between the top surface of said conductive semiconductor layer and grains of said conductive semiconductor layer having a rugged surface, etching said conductive semiconductor layer having a rugged surface, said conductive semiconductor layer and said semiconductor oxide layer, employing said etching mask, to produce a first electrode having a shape of vertical cylinder having an open top end and a closed bottom end, producing a dielectric layer to cover at least said first electrode having a shape of a vertical cylinder having an open top end and a closed bottom end, and producing a second electrode of a conductive material, said second electrode covering said dielectric layer.

2. A method for producing a semiconductor device which acts as a capacitor comprising:

producing a plug-shaped conductive semiconductor layer on a conductive semiconductor substrate, said plug-shaped conductive semiconductor layer being surrounded by an insulator layer, producing a semiconductor oxide layer on said insulator layer, said semiconductor oxide layer having an opening at a location corresponding to said plug-shaped conductive semiconductor layer, producing a conductive semiconductor layer and a conductive semiconductor layer having a rugged surface on said plug-shaped conductive semiconductor layer and said semiconductor oxide layer, producing an etching mask layer on said conductive semiconductor layer having a rugged surface, employing a process employing thermal decomposition of tetraethylorthosilicate in a volume of $O_3$ such that a volumetric ratio of $O_3$ and tetraethylorthosilicate in gas phase is greater than 2:1, etching back said etching mask layer until a top surface of said conductive semiconductor layer having a rugged surface is exposed, to convert said etching mask layer to an etching mask, etching said conductive semiconductor layer having a rugged surface, said conductive semiconductor layer and said semiconductor oxide layer, employing said etching mask, to produce a first electrode having a shape of a vertical cylinder having an open top end and a closed bottom end, producing a dielectric layer to cover at least said first electrode having a shape of a vertical cylinder having an open top end and a closed bottom end, and producing a second electrode of a conductive material, said second electrode covering said dielectric layer.

3. A method for producing a semiconductor device which acts as a capacitor in accordance with claim 2, wherein the volumetric ratio of $O_3$ and tetraethylorthosilicate contained in a reaction gas employed for the process for producing said etching mask layer is approximately 10:1.

4. A method for producing a semiconductor device which acts as a capacitor comprising:

producing a plug-shaped conductive semiconductor layer on a conductive semiconductor substrate, said plug-shaped conductive semiconductor layer being surrounded by an insulator layer, producing a semiconductor oxide layer on said insulator layer, said semiconductor oxide layer having an opening at a location corresponding to said plug-shaped conductive semiconductor layer, producing a conductive semiconductor layer on said plug-shaped conductive semiconductor layer and on said semiconductor oxide layer having an opening at a location corresponding to said plug-shaped conductive semiconductor layer, producing a first etching mask layer on said conductive semiconductor layer, etching back said first etching mask layer until a top surface of said conductive semiconductor layer is exposed, to convert said first etching mask layer to a first etching mask, at a location corresponding to said plug-shaped conductive semiconductor layer, removing said first etching mask from the area on which said capacitor is not produced, producing a conductive semiconductor layer having a rugged surface on said conductive semiconductor layer and on said semiconductor oxide layer, producing a second etching mask layer on said conductive semiconductor layer having a rugged surface, etching back said second etching mask layer until the top surface of said conductive semiconductor layer having a rugged surface is exposed, to convert said second etching mask layer to a second etching mask, etching said conductive semiconductor layer having a rugged surface and said semiconductor oxide layer, employing said second etching mask, to produce a first electrode having a shape of a vertical cylinder having an open top end and a closed bottom end, producing a dielectric layer to cover at least said first electrode having a shape of a vertical cylinder having an open top end and a closed bottom end, and producing a second electrode of a conductive material, said second electrode covering said dielectric layer.

5. A method for producing a semiconductor device acting as a capacitor in accordance with claim 4, wherein said first etching mask layer is a photo resist layer and said second etching mask layer is a layer of a semiconductor oxide.

* * * * *